(12) United States Patent
Pi et al.

(10) Patent No.: US 9,525,513 B2
(45) Date of Patent: *Dec. 20, 2016

(54) METHODS AND APPARATUS TO IMPROVE PERFORMANCE AND ENABLE FAST DECODING OF TRANSMISSIONS WITH MULTIPLE CODE BLOCKS

(71) Applicant: Samsung Electronics Co., Ltd., Suwon-si, Gyeonggi-do (KR)

(72) Inventors: Zhouyue Pi, Allen, TX (US); Farooq Khan, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/877,558

(22) Filed: Oct. 7, 2015

(65) Prior Publication Data

US 2016/0028505 A1  Jan. 28, 2016

Related U.S. Application Data

(60) Division of application No. 13/678,321, filed on Nov. 15, 2012, which is a continuation of application No.
(Continued)

(51) Int. Cl.
*G07F 11/10* (2006.01)
*H04L 1/00* (2006.01)
(Continued)

(52) U.S. Cl.
CPC ......... *H04L 1/0041* (2013.01); *G06F 11/1004* (2013.01); *H03M 13/09* (2013.01);
(Continued)

(58) Field of Classification Search
CPC ........ H04L 1/04; H04L 1/0618; H04L 1/1819; H04L 1/1867; H04L 25/0204; H04L 25/0224; H04L 27/2647; H04L 5/0007; H04L 5/0048; H04L 5/0053; H04L 1/0003; H04L 1/0026; H04L 1/005; H04L 1/0061; H04L 1/0065; H04L 1/0068; H04L 1/0071; H04L 1/7107; H03M 13/09; H03M 13/091; H04B 7/0439; H04B 7/0452; H04B 7/068; H04J 11/004; G06F 11/104; G06F 11/10; G06F 11/1004

See application file for complete search history.

(56) References Cited

U.S. PATENT DOCUMENTS 5,778,013 A * 7/1998 Jedwab ............... H03M 13/091
  714/807
5,914,928 A * 6/1999 Takahashi ............ G11B 7/0037
  369/275.3

(Continued)

FOREIGN PATENT DOCUMENTS

CN 1661951 8/2005
EP 1689110 8/2006

(Continued)

OTHER PUBLICATIONS

European Search Report dated Feb. 11, 2014 in connection with European Patent Application Serial No. 08004473.8; 15 pages.

(Continued)

*Primary Examiner* — Albert Decady
*Assistant Examiner* — Enamul M Kabir

(57) ABSTRACT

Resource elements from multiple code blocks are separated into different groups, and decoding the code bits of the resource elements within each group without waiting for a completed reception of a transport block to start decoding. Coded bits from multiple code blocks are separated into different groups, and the code blocks containing coded bits within each group are decoded. A first CRC is attached to the transport block and a second CRC is attached to at least one code block from the transport block. An improved channel interleaver design includes mapping from coded bits of different code blocks to modulation symbols, and mapping from modulation symbols to time, frequency, and spatial resources, to make sure each code block to get roughly the same level of protection.

10 Claims, 30 Drawing Sheets

Related U.S. Application Data

12/039,645, filed on Feb. 28, 2008, now Pat. No. 8,379,738.

(60) Provisional application No. 60/918,503, filed on Mar. 16, 2007, provisional application No. 60/920,056, filed on Mar. 26, 2007, provisional application No. 60/920,324, filed on Mar. 27, 2007.

(51) Int. Cl.

| | | |
|---|---|---|
| H04L 1/18 | (2006.01) | |
| H04L 27/26 | (2006.01) | |
| H03M 13/09 | (2006.01) | |
| H04B 1/7107 | (2011.01) | |
| H04B 7/06 | (2006.01) | |
| H04J 11/00 | (2006.01) | |
| H04L 1/04 | (2006.01) | |
| H04L 5/00 | (2006.01) | |
| H04L 25/02 | (2006.01) | |
| G06F 11/10 | (2006.01) | |
| H04L 1/06 | (2006.01) | |
| H04B 7/04 | (2006.01) | |

(52) U.S. Cl.
CPC ........... *H04B 1/7107* (2013.01); *H04B 7/068* (2013.01); *H04J 11/004* (2013.01); *H04L 1/0003* (2013.01); *H04L 1/005* (2013.01); *H04L 1/0061* (2013.01); *H04L 1/0065* (2013.01); *H04L 1/0068* (2013.01); *H04L 1/0071* (2013.01); *H04L 1/04* (2013.01); *H04L 1/1819* (2013.01); *H04L 1/1867* (2013.01); *H04L 5/0007* (2013.01); *H04L 5/0048* (2013.01); *H04L 5/0053* (2013.01); *H04L 25/0204* (2013.01); *H04L 25/0224* (2013.01); *H04L 27/2647* (2013.01); *H04B 7/0439* (2013.01); *H04B 7/0452* (2013.01); *H04L 1/0026* (2013.01); *H04L 1/0618* (2013.01)

(56) References Cited

U.S. PATENT DOCUMENTS

| | | | | |
|---|---|---|---|---|
| 6,173,431 | B1 * | 1/2001 | Rittle | H03M 13/2918 714/746 |
| 6,756,872 | B2 | 6/2004 | Penther | |
| 7,010,740 | B1 * | 3/2006 | Walton | G06F 11/2005 714/763 |
| 7,392,460 | B2 | 6/2008 | Kim et al. | |
| 7,400,607 | B2 | 7/2008 | Kim et al. | |
| 7,478,313 | B2 | 1/2009 | Kim et al. | |
| 7,526,710 | B2 * | 4/2009 | Sawaguchi | G11B 20/1833 714/755 |
| 7,920,884 | B2 * | 4/2011 | Agrawal | H04B 7/2656 370/330 |
| 8,265,768 | B2 * | 9/2012 | Klostermann | A61N 1/37252 607/30 |
| 8,320,828 | B2 | 11/2012 | Imai et al. | |
| 2003/0023929 | A1 * | 1/2003 | Kajita | H03M 13/09 714/781 |
| 2003/0079170 | A1 | 4/2003 | Stewart et al. | |
| 2003/0123409 | A1 | 7/2003 | Kwak et al. | |
| 2004/0187062 | A1 | 9/2004 | Kajita | |
| 2004/0268206 | A1 * | 12/2004 | Kim | H04L 1/0003 714/758 |
| 2005/0008026 | A1 | 1/2005 | Tanaka et al. | |
| 2005/0052991 | A1 | 3/2005 | Kadous | |
| 2005/0053168 | A1 * | 3/2005 | Song | H04L 1/1819 375/261 |
| 2005/0108610 | A1 * | 5/2005 | Kim | H04L 1/0041 714/748 |
| 2005/0193310 | A1 * | 9/2005 | Obuchi | H04L 1/0068 714/752 |
| 2006/0013330 | A1 | 1/2006 | Ha | |
| 2006/0018279 | A1 | 1/2006 | Agrawal et al. | |
| 2006/0195762 | A1 | 8/2006 | Back | |
| 2007/0030830 | A1 * | 2/2007 | Sagne | H04L 12/189 370/336 |
| 2007/0030836 | A1 | 2/2007 | Suh et al. | |
| 2007/0049990 | A1 | 3/2007 | Klostermann et al. | |
| 2007/0124657 | A1 * | 5/2007 | Orio | H03M 13/2975 714/794 |
| 2009/0119570 | A1 * | 5/2009 | Eder | H04L 1/0046 714/792 |
| 2009/0303913 | A1 * | 12/2009 | Yu | H04B 7/0669 370/312 |

FOREIGN PATENT DOCUMENTS

| | | |
|---|---|---|
| JP | 09-98093 | 4/1997 |
| JP | 2000-091967 A | 3/2000 |
| JP | 2000511036 | 8/2000 |
| JP | 2002-208882 A | 7/2002 |
| JP | 2004-312687 A | 11/2004 |
| JP | 2005-033399 A | 2/2005 |
| JP | 2005151571 | 6/2005 |
| JP | 2005167499 | 6/2005 |
| JP | 2006-186557 | 7/2006 |
| JP | 2006203355 | 8/2006 |
| JP | 2008-118483 | 5/2008 |
| WO | WO 2005/069571 | 7/2005 |
| WO | WO 2005/074184 | 8/2005 |
| WO | WO 2006/069300 | 6/2006 |
| WO | WO 2006/071761 A1 | 7/2006 |
| WO | WO 2006/102745 | 10/2006 |
| WO | WO 2007/021153 | 2/2007 |
| WO | WO 2007/024932 | 3/2007 |
| WO | WO 2008/093619 A1 | 8/2008 |

OTHER PUBLICATIONS

Translated Korean Office Action dated Feb. 13, 2014 in connection with Korean Patent Application 10-2009-7018278; 5 pages.
Canada Office Action dated Feb. 13, 2014 in connection with Canadian Patent Application 2,680,375;3 pages.
Translated Japan Office Action dated Mar. 4, 2014 in connection with Japanese Application 2012-008717; 7 pages.
Office Action dated Jun. 12, 2013 in connection with U.S. Appl. No. 13/603,116.
Japanese Office Action dated Jun. 18, 2013 in connection with Japanese Patent application JP2012-008717; 10 pages.
Translated Notice of Allowance dated Jul. 8, 2014 in connection with Japanese Patent Application Serial No. 2012-008717; 6 pages.
Office Action dated Oct. 10, 2013 in connection with U.S. Appl. No. 13/603,116, 9 pgs.
European Search Report dated Nov. 25, 2013 in connection with European Patent Application Serial No. 08004473.8, 5 pages.
ETSI, "Universal Mobile Telecommunications Systems (UMTS); UTRA (UE) TDD; Radio Transmission and reception", (3GPPTS 25.102 Version 5.3.0 Release 5), Dec. 2002, 87 pages.
Qualcomm Europe, "CRC for Multiple Code Block Transmissions", 3GPP TSG-RAN WG1 #50, Aug. 20-24, 2007, Athens, Greece, 3 pages.
Office Action dated Feb. 22, 2013 in connection with U.S. Appl. No. 13/603,116.
Japanese Office Action Examination Report dated Oct. 14, 2014 in connection with Japanese Patent Application No. 2013-193152, 10 pgs.
Text of the First Office Action, dated Jul. 15, 2015, in connection wit Chinese Patent Application No. 201310187679.5, 28 pgs.
Zhouyue Pi et al., U.S Office Action issued for U.S. Appl. No. 13/678,321 dated Jan. 14, 2016, 12 pgs.
Zhouyue Pi et al., U.S Office Action issued for U.S. Appl. No. 13/678,321 dated Jun. 5, 2015, 12 pgs.

(56) References Cited

OTHER PUBLICATIONS

Japanese Office Action issued for JP 2015-063858 dated Feb. 22, 2016, 10 pgs.
Samsung, "Text Proposal on MIMO for Evolved UTRA", R1-060336, 3GPP tSG RAN WG1 Meeting #44, dated Feb. 1, 2006, 3 pgs.
Intel Corporation, "MLD vs. SIC Complexity Analysis for 2×2 MIMO OFDM", R1-061965, 3GPP TSG-RAN WG1 #46, dated Aug. 1, 2006, 6 pgs.
Samsung, "Analysis of Per Code Block CRC and Per Transport Block CRC", R1-073108, 3GPP TSG RAN WG1 Meeting #49-bis, dated Jun. 20, 2007, 4 pgs.

* cited by examiner

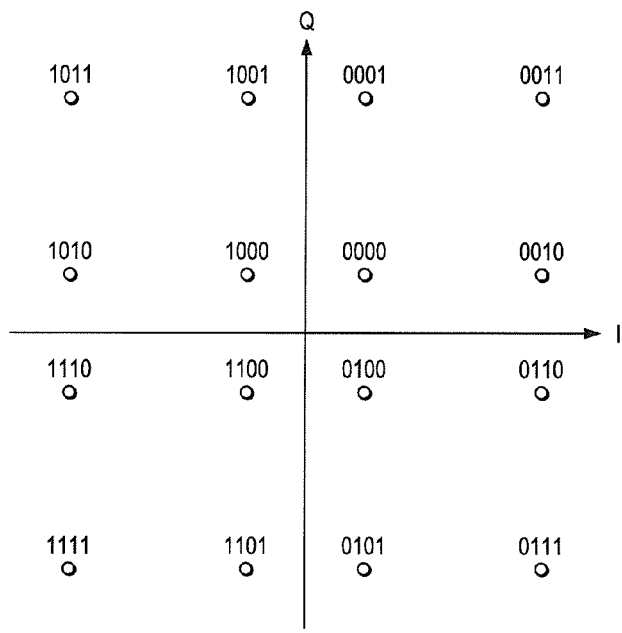
(a) 16-QAM CONSTELLATION $b_3 b_2 b_1 b_0$
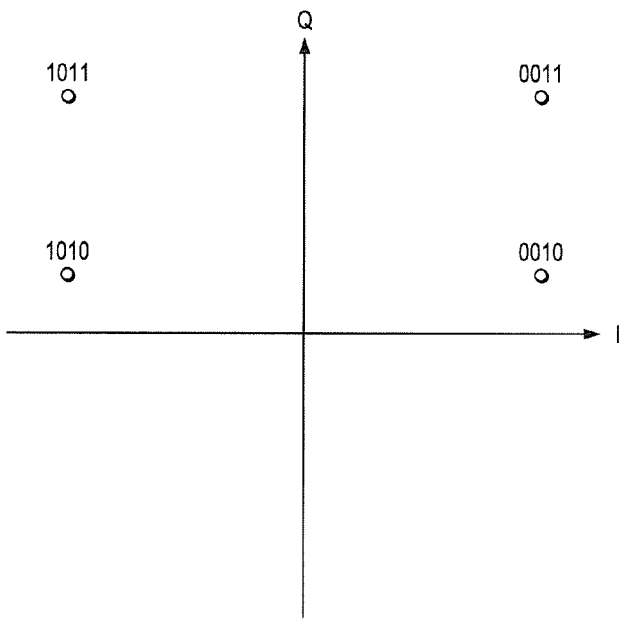
(b) REDUCED 16-QAM CONSTELLATION WITH $b_2 = 0$ AND $b_1 = 1$
FIG. 25

METHODS AND APPARATUS TO IMPROVE PERFORMANCE AND ENABLE FAST DECODING OF TRANSMISSIONS WITH MULTIPLE CODE BLOCKS

CLAIM OF PRIORITY

This application is a divisional of U.S. Non-Provisional patent application Ser. No. 13/678,321 filed Nov. 15, 2012, which is a continuation of U.S. Non-Provisional patent application Ser. No. 12/039,645 filed Feb. 28, 2008, which claims priority to U.S. Provisional Patent Application No. 60/918,503 filed Mar. 16, 2007, U.S. Provisional Patent Application No. 60/920,056 filed on Mar. 26, 2007, and U.S. Provisional Patent Application No. 60/920,324 filed on Mar. 27, 2007. The content of the above-identified patent documents is hereby incorporated by reference.

TECHNICAL FIELD

The present disclosure relates to methods and apparatus for a data transmission in a communication system, and more specifically, to methods and apparatus for improving performance of transmission with multiple code blocks and enabling fast decoding of transmissions with multiple code blocks in a communication system.

BACKGROUND

In order to maintain good channel estimation performance in a wireless communication system, interpolation of reference signals at selected resource elements located around a resource element to be estimated is often used to obtain channel estimation for the resource element with improved performance. This however, means that the demodulation of the modulation symbol in the resource element to be estimated needs to wait until all the resource elements selected for estimating the resource element are received. In other words, if the need for demodulation of the resource element to be estimated occurs before reception of the Orthogonal Frequency Division Multiplexing (OFDM) symbol which contains some of or all of the selected resource elements for estimating the resource element, the channel estimation performance for resource elements may be deleteriously affected.

SUMMARY

It is, therefore, an object of the present disclosure to provide improved methods and apparatus of transmission of signals with multiple code blocks.

It is another object of the present disclosure to provide an improved design of channel interleavers and improved wireless receivers.

It is another object of the present disclosure to provide methods and apparatus enabling fast decoding of multiple code blocks while maintaining good channel estimation performance.

It is another object of this disclosure to provide an improved method and an improved apparatus for transmitting data by enabling fast decoding of transmissions of signals carrying multiple code blocks.

In one embodiment of the present disclosure, an improved design of a channel interleaver and receiver is provided and a separate coding method of multiple code blocks is taken into account in order to improve the performance. The design for the channel interleaver, including the mapping from coded bits of different code blocks to modulation symbols, and the mapping from modulation symbols to time, frequency, and spatial resources, assures that each code block gets roughly the same level of protection. On the receiver side, when some code blocks are received correctly and some are not, the signal of the successfully decoded code blocks may be reconstructed and cancelled from the received signal. After the cancellation, the receiver may attempt to re-decode the other code blocks. The interference with other code blocks that are not yet successfully decoded may be therefore greatly reduced, and the probability that the receiver will be able to decode the other code blocks may thus be significantly increased.

In one embodiment of the disclosure prior to transmission, a cyclic redundancy check (CRC) is added to each code block to enable error detection for each code block. After the transport block CRC attachment, the bit scrambling, and the code block segmentation, a code block CRC is attached to at least one of the code blocks and the signal is transmitted. Note that if there is only one code block in the transport block, the code block CRC may not be necessary. The CRC overhead may be further reduced by only attaching one code block CRC for multiple code blocks prior to transmission.

In the present disclosure, a number of steps are provided to be applied in the improved channel interleaver design.

Step 1

Firstly, for each code block, symbols S, $P_1$, $P_2$, contemplate, respectively, the systematic bits, parity bits from encoder 1 of a turbo encoder, and parity bits from encoder 2 of the turbo encoder. In one embodiment of the present disclosure, the coded bits after the second rate matching are re-arranged based on code blocks. The re-arranged bits may be used to fill up the time-frequency resources, and the modulation positions in modulation symbols.

Step 2

Secondly, these bits first fill up the space along the dimension of frequency (i.e. sub-carrier) index. Then they fill up the space along the dimension of time (i.e., an orthogonal frequency division multiplexing or "OFDM" symbol) index. At last they fill up the space along the dimension of modulation position index. Other ordering of dimensions is certainly possible and covered by the present disclosure.

Step 3

Thirdly, for each modulation position index and each OFDM symbol, the data bits are interleaved along the frequency dimension. For example, a bit-reverse-order (BRO) interleaver or a pruned bit-reverse-order interleaver may be used, or any other interleaver may be used for this purpose. Sometimes, one or multiple of simplified shuffling patterns may be used. For example, cyclic shifts, or predetermined interleaving/re-arrangement/shuffling/swapping patterns may be used. These patterns may or may not change for each OFDM symbol and/or each modulation position index. Sometimes the number of resource elements available in each OFDM symbol may be different due to different amount of puncturing or usage by other channels in these OFDM symbols. In that case, interleaver with different sizes may be used on different OFDM symbols.

Step 4

Fourth, for each modulation position index and each sub-carrier, the data bits are interleaved along the time dimension. For example, a BRO interleaver or a pruned bit-reverse-order interleaver may be used. Or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each modulation position and/or sub-carrier index. Sometimes, the number of resource elements available on each sub-carrier index may be different due to different amount of puncturing or usage by other channels on this sub-carrier. In that case, interleaver with different sizes may be used on different sub-carriers.

Step 5

Fifth, for each sub-carrier and each OFDM symbol, the data bits are interleaved along the dimension of modulation position index. For example, a BRO interleaver or a pruned bit-reverse-order interleaver may be used, or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each sub-carrier and/or each OFDM symbol. Preferred patterns will be explained later in the present disclosure.

Another preferred embodiment of the channel interleaver design consists of at least one of the above-stated five steps.

The aforementioned embodiments of channel interleaver design may be easily extended to the case of multiple input, multiple output (MIMO) transmissions. Suppose multiple layers are allocated to a MIMO codeword. This scenario may apply to Long Term Evolution (LTE) systems, e.g., when the single user MIMO (SU-MIMO) transmission has rank greater than 1. In this case, a spatial dimension is added in the channel interleaver design. The space for the coded bits may be described as a four-dimensional space in time, frequency, space and modulation positions.

In another embodiment of the disclosure, the aforementioned embodiments are extended to MIMO transmissions with different spatial dimensions on different resource elements.

In a MIMO system, the rank (number of spatial dimensions, or layers) may be different on different frequency resource elements. The aforementioned embodiments may also be extended to transmissions with different modulation order on different resources. For example, if two resource blocks have very different channel quality indicators (CQI), the transmitter may use different modulation orders on these two resource blocks. In this case, the design goal of spreading coded bits of each code block as much as possible over time, frequency, spatial, and modulation positions still applies. Special handling needs to be implemented to handle the case of different spatial dimensions or different modulation orders on different time-frequency resources. For example, similar to the resource element map, a map can be constructed to include spatial and modulation position dimension. The layers or the modulation positions that are not available will be skipped.

In another embodiment of the disclosure, systematic bits priority is given in mapping coded bits, and modulation symbols formed by these coded bits, onto resource elements and spatial dimensions.

The prioritization of systematic bit may also be implemented by defining multiple regions along the dimension of modulation positions.

In another embodiment of the disclosure, the coded bits of each code block are allocated as uniformly as possible on different modulation positions. There are various ways to achieve this goal. One approach is to enumerate all the permutation patterns of the modulation positions.

A subset of the permutation patterns may be selected. For example, one seed permutation pattern with its cyclic shifted versions may be used as one subset of patterns.

Certainly, the selection of a subset of permutation patterns may be various and depends on other design objectives. For example, not all cyclic shifts are needed in the selected subset. Cyclic shifts from multiple seed permutation patterns may be selected.

Different preferred seed permutation patterns, and their cyclic shifts, may be obtained by reading the positions along a circle, starting from any position and by going either clockwise or counter-clockwise. In this way, maximum separation of the modulation positions with the same level of protection is achieved. This method is also applicable to other modulation orders. Although the seed permutation patterns are generated in this way, and their cyclic shifts, are preferable, this disclosure certainly covers the application of the modulation position interleaving, permutation, shuffling, swapping, re-arranging on resource elements and/or across retransmissions with any pattern or in any fashion.

In another embodiment of this disclosure, an iterative operation is proposed for receiving the multiple code blocks that are multiplexed together within modulation symbols. With the aforementioned channel interleaver design, the coded bits of different code blocks are multiplexed in the same modulation symbol.

Parallel processing may be also possible in the decoding operation. After the decoding operation, some code blocks may be successfully decoded while some others are not. In this case, the code blocks of those decoded code blocks are reconstructed. Because the coded bits of these blocks are multiplexed in the same modulation symbols with the coded bits of those code blocks that are unsuccessful, the information of these coded bits are used to help the detection of the coded blocks that are yet unsuccessful.

In another embodiment of the present disclosure, a reduced constellation may improve the detection performance of the transmission.

In another embodiment of the present disclosure, the iterative operation may be performed without correctly decoding and re-encoding some of the code blocks. Instead, reliability of the coded and information bits may be used to pass through the iterations to improve detection performance. One representation of reliability is called extrinsic information, which is the new likelihood information about each bit that is passed between the multiple processing blocks within the iterative loop.

In another embodiment of the disclosure, multiple OFDM symbols in a subframe are separated into numbers of groups with the boundary between at least two groups located in the Reference Signal (RS) OFDM symbols, or those OFDM symbols right before or right after the RS OFDM symbols. Each group contains resource elements that will carry coded bits from at least one code block. The resource elements in each group are contiguous or close to each other in time domain. Therefore, the receiver can start decoding of at least one code block after receiving all the resource elements in each group. Different configuration of groups can be used in different situations, such as, but not limited to, different user equipment (UEs), different subframes, different quality of service, etc. without departing from the spirit of this disclosure.

In another embodiment of this disclosure, the groups are defined based on code blocks instead of resource elements. Each group contains coded bits of at least one code block and may contain multiple code blocks.

With the group defined in aforementioned embodiments, either based on resource elements or code blocks, the rest of channel interleaving operations may be defined within each group.

The aforementioned embodiments of channel interleaver design can be extended to the case of MIMO transmissions. When the SU-MIMO transmission has a transmission rank greater than 1, multiple layers are allocated to a MIMO codeword. In this case, a spatial dimension can be added to the definition of one group. Therefore, there may be multiple layers or streams within each group, and there may be multiple groups within each MIMO layer or MIMO stream. In a multi-codeword MIMO transmission, the layers or streams may contain multiple MIMO codewords (CW), each of which carries multiple code blocks and a 24-bit CRC. The demodulation of the later groups is parallelized with the decoding of earlier groups. With the help of CRC, the interference from one codeword to another codeword is cancelled by successive interference cancellation.

In another embodiment of this disclosure, a CRC may be added to one or multiple code blocks of a codeword within one group. By doing so, the demodulation of the later groups in one codeword, the decoding of earlier groups in this codeword, the successive interference cancellation, the demodulation of the later groups in another codeword, and the decoding of earlier groups in the other codeword can all be processed paralleled in one way or another.

In another embodiment of this disclosure, a CRC may be added to the groups of multiple MIMO codewords separately. In this embodiment, parallel processing may be enabled even for an iterative receiver.

Several variations and receiver structures may be obtained without deviating from the principle of this disclosure.

BRIEF DESCRIPTION OF THE DRAWINGS

A more complete appreciation of the principles of the present disclosure, and many of the attendant advantages thereof, will be readily apparent as the same becomes better understood by reference to the following detailed description when considered in conjunction with the accompanying drawings in which like reference symbols indicate the same or similar components, wherein:

FIG. 25 shows an example of a reduced constellation which improves the detection performance of the transmission suitable for the practice of the principles of another embodiment of the present disclosure;

DETAILED DESCRIPTION

Figure 1:
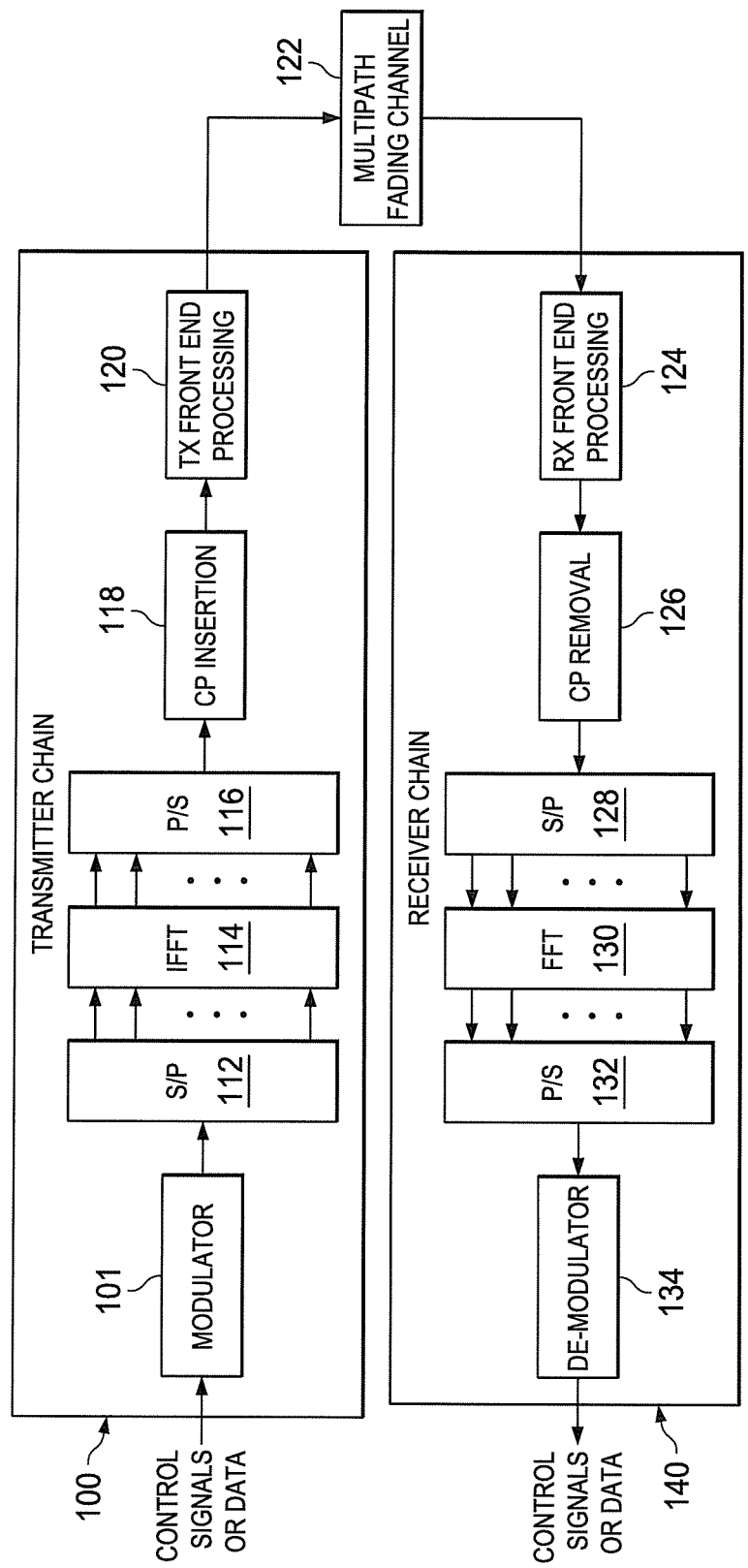
FIG. 1 is an illustration of an OFDM transceiver chain having transmitter chain and receiver chain.

OFDM is a technology to multiplex data in frequency domain. Modulation symbols are carried on frequency sub-carriers and the sub-carriers overlap with each other in frequency domain. The orthogonality is, however, maintained at the sampling frequency in the assumption that the transmitter and receiver have perfect frequency synchronization. In the case of frequency offset due to an imperfect frequency synchronization or due to high mobility, the orthogonality of the sub-carriers at sampling frequencies is destroyed, resulting in Inter-Carrier-Interference (ICI).

A cyclic prefix (CP) portion of the received signal is often corrupted by the previous OFDM symbol of multipath fading. When the cyclic prefix (CP) portion is sufficiently long, the received OFDM symbol without a CP portion should only contain its own signal convoluted by the multipath fading channel. The main advantage of OFDM over other transmission schemes is that OFDM demonstrates robustness to compensate for multipath fading.

SC-FDMA utilizes single carrier modulation and frequency domain equalization, is a technique that has similar performance and complexity to that of an Orthognal Frequency Division Multiplexing Access (OFDMA) system. SC-FDMA is selected as the uplink multiple access scheme in the 3GPP LTE. 3GPP LTE is a project within the 3GPP to improve the Universal Mobile Telecommunications System (UMTS) mobile phone standard to cope with future requirements.

HARQ is widely used in communication systems to combat decoding failure and improve reliability. N-channel synchronous HARQ is often used in wireless communication systems because of the simplicity of N-channel synchronous HARQ. Synchronous HARQ has been accepted as the HARQ scheme for the LTE uplink in 3GPP. On the downlink of LTE systems, asynchronous adaptive HARQ has been accepted as the HARQ scheme due to its flexibility and additional performance benefits beyond synchronous HARQ.

Multiple antenna communication systems, which are often referred to as MIMO systems, are widely used in wireless communication to improve the performance of communication systems. In a MIMO system, a transmitter has multiple antennas capable of transmitting independent signals and a receiver is equipped with multiple receiving antennas. Many MIMO schemes are often used in an advanced wireless system.

When a channel is favorable, e.g., when the mobile speed is low, it is possible to use a closed-loop MIMO scheme to improve the system performance. In closed-loop MIMO systems, the receivers feed back to the transmitter the channel condition and/or preferred transmission MIMO processing schemes. The transmitter utilizes this feedback information, together with other considerations such as scheduling priority, data and resource availability, to jointly optimize the transmission scheme. A popular closed loop MIMO scheme is called MIMO precoding. With precoding, the transmit data streams are pre-multiplied by a precoding matrix before being passed on to the multiple transmit antennas.

Another perspective of a MIMO system is whether the multiple data streams for transmission are encoded separately or encoded together. All the layers for data transmission are encoded together in the single codeword (SCW) MIMO system, while all the layers may be encoded separately in the multiple codeword (MCW) MIMO system. Both SU-MIMO and Multi-User MIMO (MU-MIMO) are adopted in the downlink of LTE. MU-MIMO is also adopted in the uplink of LTE; the adoption of SU-MIMO for the LTE uplink, however, is still under discussion.

In an LTE system, when the transport block is large, the transport block is segmented into multiple code blocks so that multiple coded packets can be generated. This breakdown of transport block provides benefits such as enabling parallel processing or pipeline implementation and flexible trade-off between power consumption and hardware complexity.

Different modulation schemes, such as quadrature phase shift keying (QPSK), binary phase shift keying (BPSK), 8 phase-shift keying (8-PSK), 16-QAM, or 64-QAM may be used for adaptive modulation and for increasing the spectral efficiency of modulation. In case of 16-QAM modulation, quadruples of bits, $b_0b_1b_2b_3$, are mapped to complex-valued modulation symbols $x=I+jQ$. Different modulation positions, however, have different protection levels.

When multiple code blocks are transmitted, the performance of the transmission is dictated by the code block that has the worst performance. A channel interleaver, including mapping from coded bits of different code blocks to modulation symbols, and mapping from modulation symbols to time, frequency, and spatial resources, needs to be carefully designed to make sure that each code block gets roughly the same level of protection. When multiple code blocks are transmitted, it is beneficial to allow the receiver to start the decoding of some code blocks while the receiver is still demodulating modulation symbols for other code blocks. In an LTE system, this presents a challenge because the channel estimation performance might be deleteriously impacted if there are not enough reference signals at the time of demodulation and decoding.

In order to maintain good channel estimation performance, interpolation of reference signals at selected resource elements located around a resource element to be estimated is often used to obtain channel estimation for the resource element with improved performance. This however, means that the demodulation of the modulation symbol in the resource element to be estimated needs to wait until all the resource elements selected for estimating the resource element are received. In other words, if the need for demodulation of the resource element to be estimated occurs before reception of the OFDM symbol which contains some of or all of the selected resource elements for estimating the resource element, the channel estimation performance for resource elements may be deleteriously affected.

In the detailed description, following terms will be frequently used and the definition of each term is provided:
  a subpacket is a portion of an encoded packet, and is a subset of the total coded bits;

data bits are a stream of information bits which are encoded to generate coded bits;

interlace refers to a subset of transmission slots or sub-frames;

synchronous HARQ (S-HARQ) is a technique employed by the current high rate packet data (HRPD) standard, which establishes a set of four time-division interlaced transmission channels used for the concurrent transmission of four different sets of data. These interlaced transmission channels are sometimes referred to as "HARQ interlaces";

a transmission slot is an allocated predetermined number of consecutive clock cycles, where a number of these transmission slots form a transmission frame;

space-time coding (STC) is a method employed to improve the reliability of data transmission in wireless communication systems using multiple transmit antennas, with STCs relying on transmitting multiple, redundant copies of a data stream to the receiver so that at least some of the data stream copies may survive in the physical path between transmission and reception in a good state to allow reliable decoding;

transmit diversity is a method that one data bit is transmitted via different independent channels;

receiver diversity is a method that one data bit is received via different independent channels;

CQI is a measurement of the communication quality of wireless channels, and can be a value (or values) representing a measure of channel quality for a given channel;

The Redundancy Version Parameter indicates which redundancy version of the data is sent;

a channel interleaver sends data interleaved via different channels in order that deep fade or collision at some channels does not void the transmission;

a resource block is a block of time and frequency resource elements that carry signals to be transmitted by the transmitter and to be received by the receiver; and a code block is a block of data bits or the block of coded bits generated by encoding the block of data bits Methods and apparatus to enable fast decoding of transmissions with multiple code blocks constructed according to the present disclosure will be described in details with reference to the accompanying drawings. Like reference numerals designate like elements throughout the specification.

Also, several additional acronyms frequently used in this disclosure are listed below with the full names:

FFT: Fast Fourier Transform

IFFT: Inverse Fast Fourier Transform

FIG. 1 shows an OFDM transceiver chain having transmitter chain and receiver chain. OFDM is a technology to multiplex data in frequency domain. Modulation symbols are carried on frequency sub-carriers. A example of an OFDM transceiver chain is shown in FIG. 1. At a transmitter chain 100, control signals or data signals are modulated by a modulator 101 and the modulated signals are serial-to-parallel converted by a serial-to-parallel convertor 112. An IFFT unit 114 is used to transfer the modulated signal or data from frequency domain to time domain, and the modulated signals transferred to time domain is parallel-to-serial converted by a parallel-to-serial convertor 116. A CP or zero prefix (ZP) is added to each OFDM symbol at a CP insertion stage 118 to avoid or mitigate the impact due to multipath fading at a multipath fading channel 122. Signals from CP insertion stage 118 are transmitted to transmitter front end processing unit 120, for example, transmit antennas (not shown on FIG. 1). At a receiver chain 140, assuming perfect time and frequency synchronization are achieved, signals received by receiver front end processing unit 124, for example, receive antennas (not shown on FIG. 1), are processed at a CP removal stage 126 in which removes the CP of the received signal. Signal processed at CP removal stage 126 is further serial-to-parallel converted by a serial-to-parallel convertor 128. An FFT unit 130 transfers the received signals from time domain to frequency domain for further processings, such as being parallel-to-serial converted by a parallel-to-serial convertor 132 and being demodulated by a de-modulator 134. Therefore, the signals transmitted by transmitter chain 100 are received by receiver chain 140.

Figure 2:
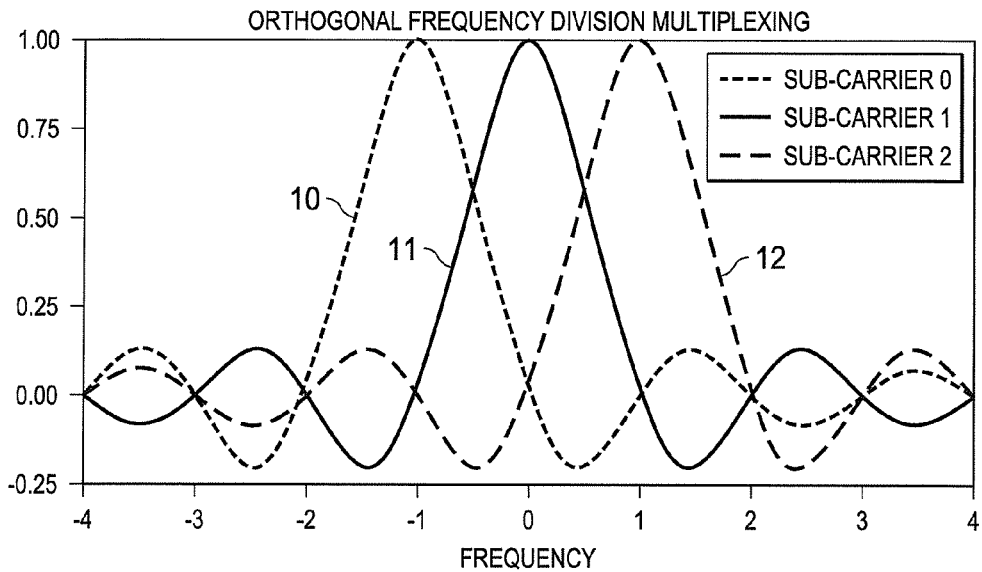
FIG. 2 is a two coordinate illustration of the orthogonality of OFDM theory.

FIG. 2 illustrates the orthogonality of OFDM theory. Because each OFDM symbol has finite duration in time domain, the sub-carriers overlap with each other in frequency domain. For example, as shown in FIG. 2, sub-carrier0 10, sub-carrier1 11 and sub-carrier2 12 overlap with each other in frequency domain, sub-carrier0 10, sub-carrier1 11 and sub-carrier2 12 have almost identical or similar wave shapes. These three sub-carriers are mathematically perpendicular to each other, in other words, the inner products of any two of the sub-carriers are zero. The orthogonality of OFDM theory, therefore, is maintained at the sampling frequency assuming the transmitter and receiver has perfect frequency synchronization. In the case of frequency offset due to imperfect frequency synchronization or high mobility, the orthogonality of the sub-carriers at sampling frequencies is destroyed, resulting in ICI.

Figure 3A:
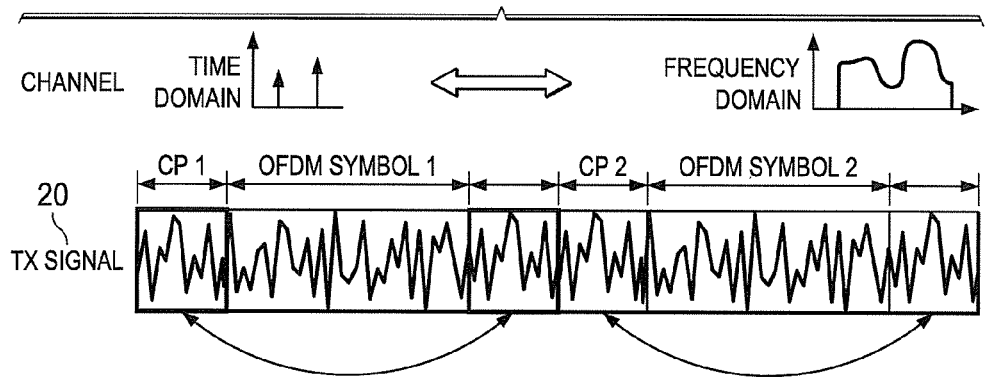
FIG. 3a is an illustration of an OFDM symbol in time domain at the transmitter.
Figure 3B:
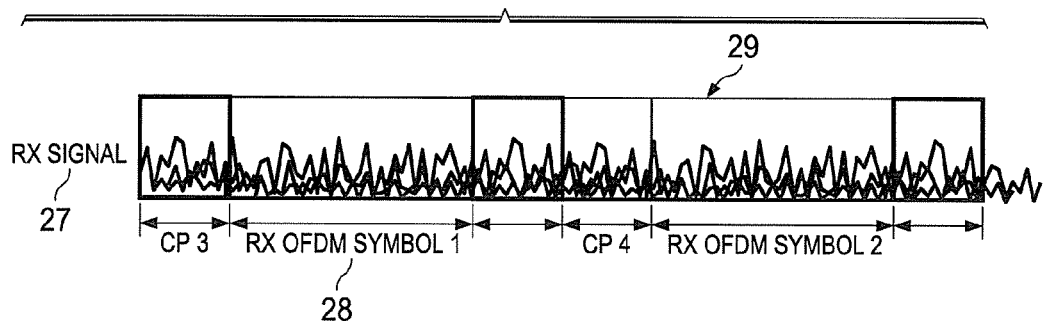
FIG. 3b is an illustration of an OFDM symbol in time domain at the receiver.

FIG. 3a is an illustration of a transmitted OFDM symbol in time domain, and FIG. 3b is an illustration of the received OFDM symbols in time domain. As shown in FIG. 3a, a multipath fading channel may be approximated as impulse response channel in time domain, and may be presented as a frequency selective channel in frequency domain. Because of multipath fading channel 122 in the OFDM transceiver chain as shown in FIG. 1, a CP portion inserted to one received symbol is often corrupted by the previous OFDM symbol. Transmit signal 20 has continuously transmitted OFDM symbols (i.e. OFDM Symbol 1, OFDM Symbol 2, . . . ), and CP portions (i.e. CP1 and CP2) are located between any of two OFDM symbols. After transmission through multipath fading channel 122, receive signal 27 has continuously CP inserted OFDM symbols (i.e., Rx OFDM Symbol1 28, Rx OFDM Symbol2 29, . . . ). Rx OFDM Symbol1 28 and Rx OFDM Symbol2 29 are corrupted by their own CP, respectively. For example, CP3 corrupts into Rx OFDM Symbol 1 28. When the length of a CP is sufficiently long, the received OFDM symbols without a CP portion, however, should only contain their own signal convoluted by the multipath fading channel. In general, an FFT process by FFT unit 130 as shown in FIG. 1 is taken at the receiver side to allow further processing in frequency domain. The advantage of OFDM over other transmission schemes is the robustness to multipath fading. The multipath fading in time domain translates into frequency selective fading in frequency domain. With the cyclic prefix or zero prefix inserted, the inter-symbol-interference between adjacent OFDM symbols are avoided or largely alleviated. Moreover, because each modulation symbol is carried over a narrow bandwidth, each modulation symbol experiences a single path fading. Simple equalization scheme may be used to combat frequency selective fading.

SC-FDMA, which utilizes single carrier modulation and frequency domain equalization, is a technique that has similar performance and complexity as those of an OFDMA system. One advantage of SC-FDMA is that the SC-FDMA signal has lower peak-to-average power ratio (PAPR) because SC-FDMA has an inherent single carrier structure. Low PAPR normally results in high efficiency of power amplifier, which is particularly important for mobile stations in uplink transmission. Single Carrier Frequency Division Multiple Access (SC-FDMA) is selected as the uplink multiple access scheme in 3GPP LTE.

Figure 4:
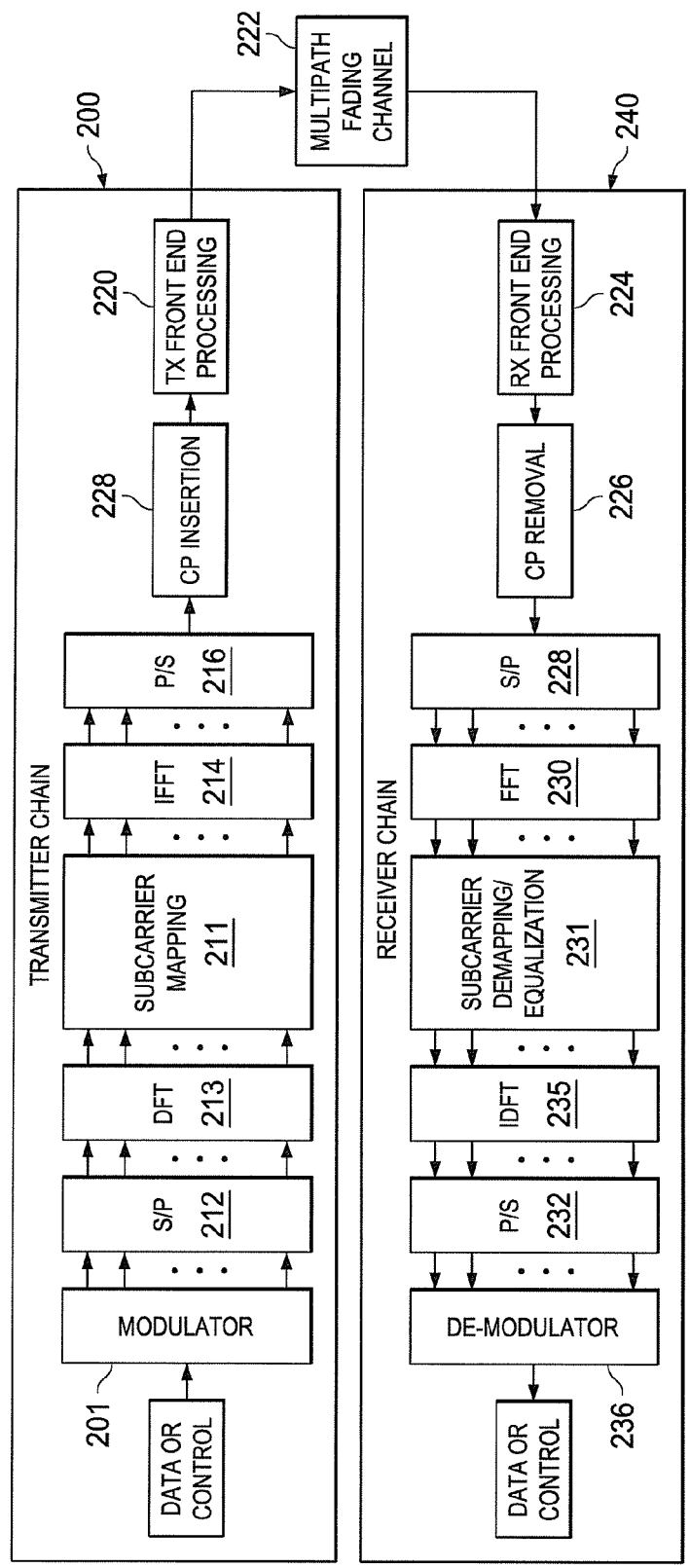
FIG. 4 shows an example of a transceiver chain for Single Carrier Frequency Division Multiple Access (SC-FDMA)

FIG. 4 shows an example of a transceiver chain for SC-FDMA. An example of the transceiver chain for SC-FDMA is shown in FIG. 4. At transmitter chain 200, time-domain data or control data is modulated by a modulator 201, and the modulated data is serial-to-parallel converted by a serial-to-parallel convertor 212. A Discrete Fourier Transform (DFT) unit 213 processes the converted data by a discrete fourier transform process. To ensure low PAPR, the transformed data is then mapped to a set of contiguous sub-carriers at a subcarrier mapping stage 211. Then an IFFT unit 214 transforms the signal back to time domain, and IFFT unit normally has a larger IFFT size than that of DFT unit 213. A parallel-to-serial convertor 216 parallel-to-serial converts the received data. The CP is added at CP insertion stage 228 before data is transmitted and processed by a transmission front end processing unit 220. Front end processing unit 220 has an amplification stage enabling wireless transmission of the plurality of groups of the encoded data bits in a predetermined sequence via a plurality of transmitting antennas. The processed signal with a cyclic prefix added is often referred to as a SC-FDMA block. After the processed signal passes through a communication channel, e.g., a multipath fading channel 222 in a wireless communication system, a receiver chain 240 performs a receiver front end processing at a receiver front end processing unit 224, removes the CP by a CP remover 226, serial-to-parallel converts the data by a serial-to-parallel convertor 228, transforms the data by a FFT unit 230 and demaps the data at a subcarrier demapping/equalization unit 231 in frequency domain. Inverse Discrete Fourier Transform (IDFT) unit 233 processes data after the equalized signal is demapped in frequency domain. The output of IDFT unit 235 is further processed by a parallel-to-serial convertor 232 and a demodulator 236.

Figure 5:
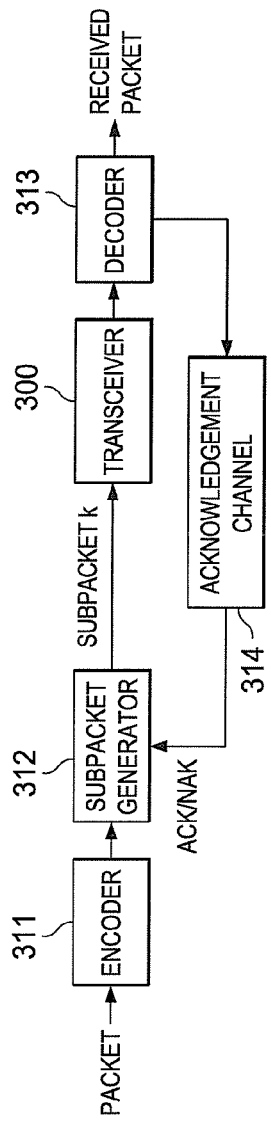
FIG. 5 is an illustration of Hybrid Automatic Repeat reQuest (HARQ) operation.

FIG. 5 is an illustration of HARQ operation. HARQ is widely used in communication systems to combat decoding failure and improve the reliability of data transmission. A HARQ operation is shown in FIG. 5. A data packet is coded by using an encoder 311 with a certain kind of Forward Error Correction (FEC) scheme. The data packet is processed by a subpacket generator 312 and a set of subpackets are generated. A subpacket, for example, a subpacket k may only contain a portion of the coded bits. If the transmission by a transceiver 300 for subpacket k fails, as indicated by a negative acknowledgement (NACK) provided by a feedback acknowledgement channel 314, a retransmission subpacket, subpacket k+1, is provided to retransmit this data packet. If subpacket k+1 is successfully transceived, an acknowledgement (ACK) is provided by feedback acknowledgement channel 314. The retransmission subpackets may contain different coded bits from previous subpackets. The receiver may softly combine or jointly decode all the received subpackets by a decoder 313 to improve the chance of decoding. Normally, a maximum number of transmissions is configured in consideration of both reliability, packet delay, and implementation complexity.

N-channel synchronous HARQ is often used in wireless communication systems because of the simplicity. For example, synchronous HARQ has been accepted as the HARQ scheme for LTE uplink in 3GPP.

Figure 6:
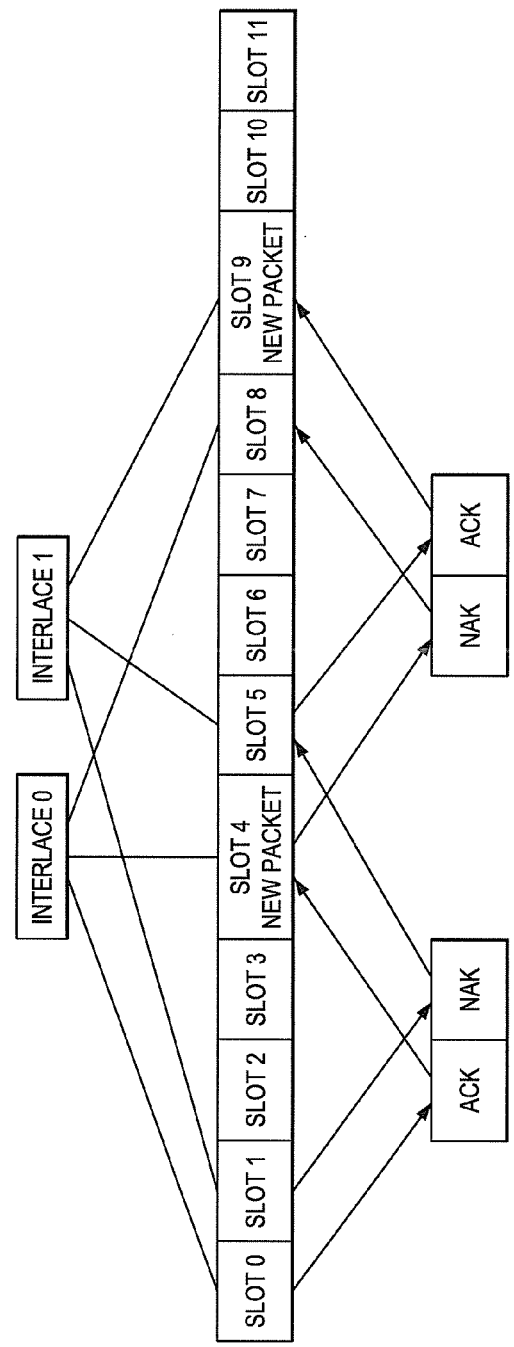
FIG. 6 shows an example of a four-channel synchronous HARQ.

FIG. 6 shows an example of a four-channel synchronous HARQ. Because of the fixed timing relationship between subsequent transmissions, the transmission slots in an individual HARQ channel exhibits an interlace structure. For example, interlace 0 includes slots 0, 4, 8, . . . , 4$k$, . . . ; interlace 1 includes slots 1, 5, 9, . . . , 4$k$+1, . . . ; interlace 2 includes slots 2, 6, 10, . . . , 4$k$+2, . . . ; interlace 3 includes slots 3, 7, 11, . . . 4$k$+3, . . . . A packet is transmitted in slot 0. After correctly decoding the packet, the receiver sends back an ACK to the transmitter. The transmitter then starts transmitting a new packet at the next slot in this interlace, i.e., slot 4. The first subpacket of the new packet transmitted in slot 4, however, is not properly received. After the transmitter receives a NACK from the receiver, the transmitter transmits another sub-packet of the same packet at the next slot in interlace 0, i.e., slot 8. Interlaces 1-3 act in similar ways as interlace 0. Sometimes the receiver may have difficulty in detecting the packet boundary, i.e., whether a subpacket is the first sub-packet of a new packet or a retransmission sub-packet. To alleviate this problem, a new packet indicator may be transmitted in a control channel that carries transmission format information for the packet. Sometimes, a more elaborated version of HARQ channel information, such as sub-packet identifier (ID), and/or HARQ channel ID, may be provided to help the receiver detect and decode the packet.

Multiple antennas communication systems, which are often referred to as MIMO systems, are widely used in wireless communication to improve system performance. In a MIMO system, the transmitter has multiple antennas capable of transmitting independent signals and the receiver is equipped with multiple receive antennas. MIMO systems degenerates to single input multiple output (SIMO) if there is only one transmit antenna or if there is only one stream of data transmitted. MIMO systems degenerates to multiple input single output (MISO) if there is only one receive antenna. MIMO systems degenerates to single input single output (SISO) if there is only one transmit antenna and one receive antenna. MIMO technology may significant increase throughput and range of the system without any increase in bandwidth or overall transmit power. In general, MIMO technology increases the spectral efficiency of a wireless communication system by exploiting the additional dimension of freedom in the space domain due to multiple antennas. There are many categories of MIMO technologies. For example, spatial multiplexing schemes increase the transmission rate by allowing multiple data streaming transmitted over multiple antennas. Transmit diversity methods such as space-time coding take advantage of spatial diversity due to multiple transmit antennas. Receiver diversity methods utilize the spatial diversity due to multiple receive antennas. Beamforming technologies improve received signal gain and reducing interference to other users. Spatial Division Multiple Access (SDMA) allows signal streams from or to multiple users to be transmitted over the same time-frequency resources. The receivers can separate the multiple data streams by the spatial signature of these data streams. Note that these MIMO transmission techniques are not mutually exclusive. In fact, multiple MIMO schemes may be used in an advanced wireless systems.

When the channel is favorable, e.g., the mobile speed is low, a closed-loop MIMO scheme may be used to improve system performance. In a closed-loop MIMO systems, receivers provide the feedback of channel condition and/or preferred transmitter MIMO processing schemes. The transmitters may utilize this feedback information, together with other considerations such as scheduling priority, data and resource availability, to jointly optimize the transmission scheme.

A popular closed-loop MIMO scheme is called MIMO precoding. During a precoding process, the data streams to be transmitted are precoded, i.e. pre-multiplied by a matrix, before being passed on to the multiple transmit antennas.

Figure 7:
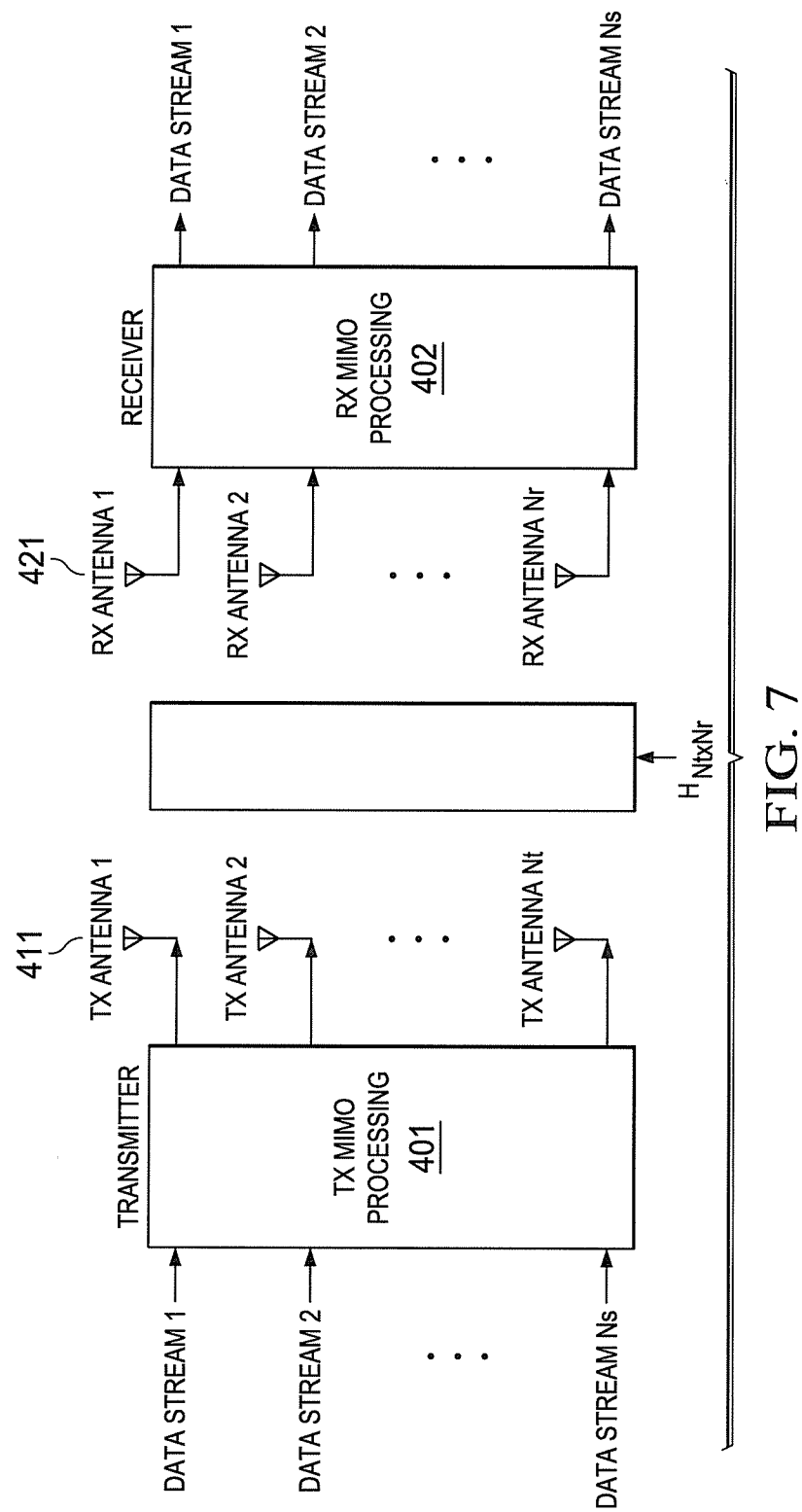
FIG. 7 is an illustration of a MIMO system.

FIG. 7 shows a MIMO system. As shown in FIG. 7, a transmitter 401 has a number of $N_t$ transmit antennas 411 and a receiver 402 has a number of $N_T$ receive antenna 421. Data streams $1, \ldots, N_s$ are transceived by this MIMO system. A matrix H is denoted as a transceive channel between transmit antennas 411 and receive antennas 421, and channel H is a $N_t$ by $N_T$ matrix. If transmitter 401 has the knowledge of channel matrix H, transmitter 401 can choose the most advantageous transmission scheme based on channel matrix H. For example, when maximizing throughput is the goal of the transmission system, a precoding matrix may be chosen to be the right singular matrix of channel matrix H if the knowledge of H is available at transmitter 401. Therefore, the effective channel for the multiple data streams at the receiver side can be diagonalized, interference between the multiple data streams may be eliminated. The overhead required to feedback the exact value of channel H, however, is often prohibitive.

Figure 8:
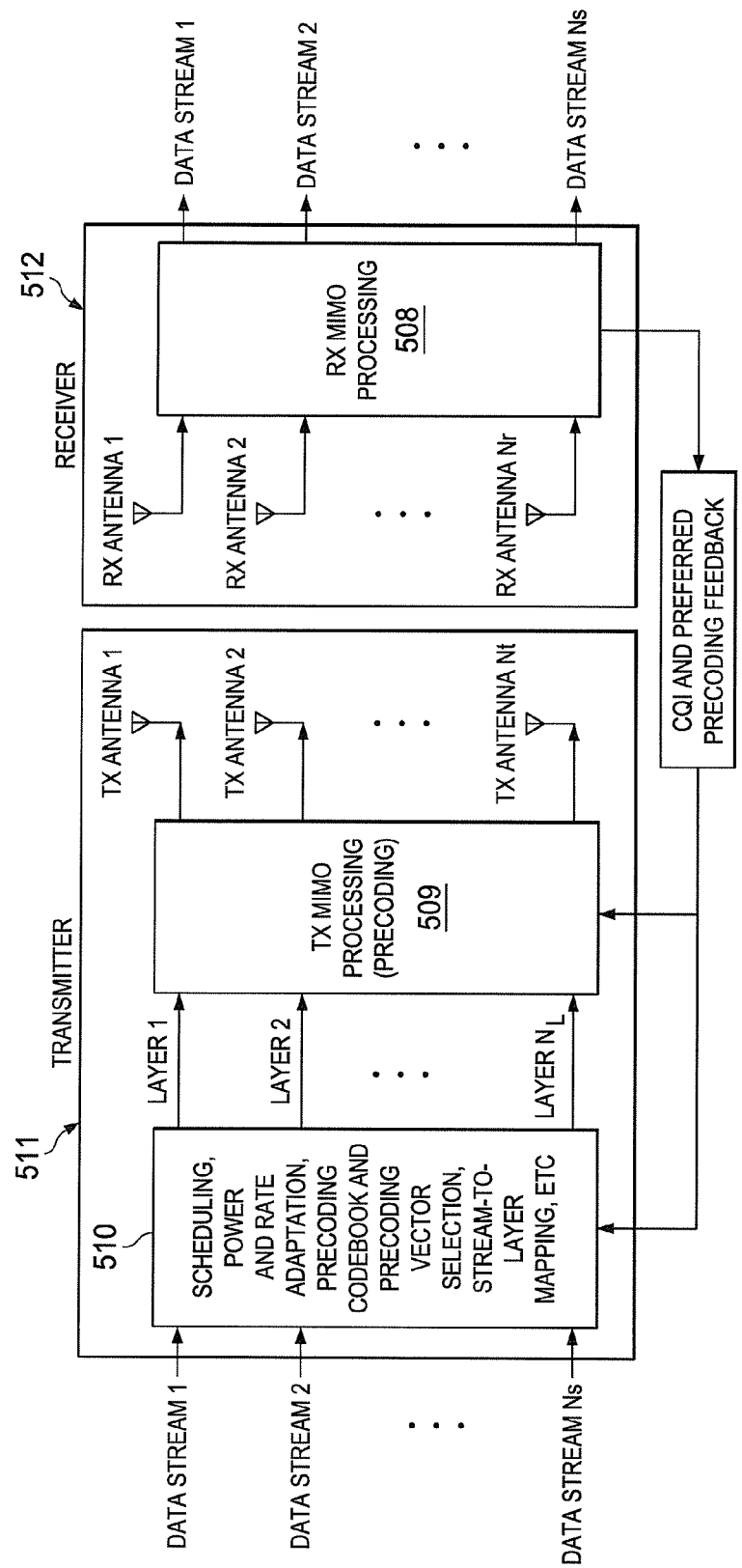
FIG. 8 is an illustration of a MIMO precoding process as used in a closed-loop MIMO system.

FIG. 8 shows a precoding process as used in a closed-loop MIMO system. As shown in FIG. 8, data streams $1, \ldots, N_s$ are processed by a processing stage 510 where a scheduling process, a power and rate adapation process, a precoding codebook and precoding vector selection process, a stream-to-layer mapping process and some other related processes are executed. Mapped data streams are transmitted via Layers $1, \ldots, N_L$ to a precoding stage 509, i.e., transmitter MIMO processing stage. The precoded data is further transmitted to transmit antennas 1, A receiver 512 receives and restores data streams $1, \ldots, N_T$ at a receiver MIMO processing stage 508. In order to reduce a feedback overhead, multiple precoding matrices are defined at transmitter 511 to quantize the space of the possible values that channel matrix H could substantiate. With the space quantization, receiver 512 feeds back the preferred precoding scheme, normally in the form of the index of the preferred precoding matrix, the transmission rank, and the indices of the preferred precoding vectors. Receiver 512 may also feed back an associated CQI values for the preferred precoding scheme.

Another perspective of a MIMO system is whether the multiple data streams to be transmitted are encoded separately or together. If all of the transmission layers are encoded together, this MIMO system is called SCW MIMO system, otherwise is called an MCW MIMO system. In the LTE downlink system, when SU-MIMO is used, up to two MIMO codewords can be transmitted to a single UE. In the case that two MIMO codewords are transmitted to a UE, the UE needs to acknowledge these two codewords separately. Another MIMO technique is called SDMA, which is also referred to sometimes as MU-MIMO. In SDMA, multiple data streams are encoded separately and transmitted to different intended receivers on the same time-frequency resources. By using different spatial signatures, e.g., antennas, virtual antennas, or precoding vectors, the receivers will be able to distinguish the multiple data streams. Moreover, by scheduling a proper group of receivers and choosing the proper spatial signature for each data stream based on channel state information, the signal of interest can be enhanced for the receiver of interest while the other signals can be enhanced for the other corresponding receivers at the same time. Therefore the system capacity may be improved. Both SU-MIMO and MU-MIMO are adopted in the downlink of LTE. MU-MIMO is also adopted in the uplink of LTE; SU-MIMO for LTE uplink, however, is still under discussion.

In an LTE system, when a transport block is large, the transport block is segmented into multiple code blocks so that multiple coded packets can be generated, which is advantageous because of benefits such as enabling parallel processing and pipeline implementation and flexible trade-off between power consumption and hardware complexity.

Figure 9:
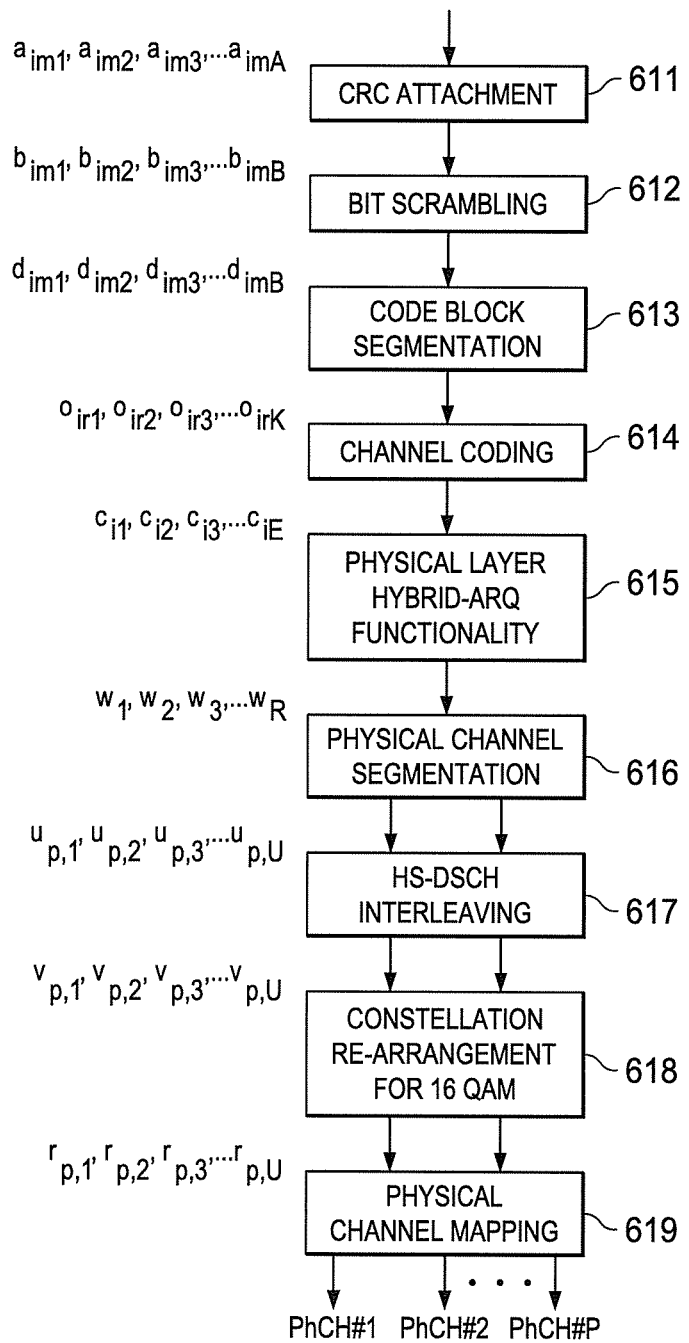
FIG. 9 is a flow chart of a coding chain for High Speed Data Shared Channel (HS-DSCH) in High Speed Downlink Packet Access (HSDPA)

As an example, the encoding process of the HS-DSCH in a HSDPA system is illustrated in FIG. 9. As shown in FIG. 9, A data bits $a_{im1}, a_{im2}, a_{im3}, \ldots, a_{imA}$ are processed at a CRC stage 611 and are transformed to B data bits $b_{im1}, b_{im2}, b_{im3}, \ldots, b_{imB}$. CRC attached data bits are bit scrambled at a bit scrambling stage 612, and are transformed to B data bits $d_{im1}, d_{im2}, d_{im3}, \ldots, d_{imB}$. Scrambled data bits are segmented at code block segmentation stage 613 and are formed to K code blocks $o_{ir1}, o_{ir2}, o_{ir3}, \ldots, o_{irK}$. Code blocks then are coded at a channel coding stage 614 and become E coded code blocks $c_{ir1}, c_{ir2}, c_{ir3}, \ldots, c_{irE}$. These coded code blocks are processed at a physical layer HARQ functionality stage 615. The resulting data bits are again segmented at a physical channel segmentation stage 616. The HARQ functionality matches the number of bits $w_1, w_2, w_3, \ldots w_R$ at the coded bits to the total number of bits of HS-DSCH physical channel. The resulting channel segmented data bits $u_{p,1}, u_{p,2}, u_{p,3}, \ldots, u_{p,U}$ are interleaved by a HS-DSCH interleaving stage 617. Interleaved data bits $v_{p,1}, v_{p,2}, v_{p,3}, \ldots, v_{p,U}$ are then re-arranged at a constellation re-arrangement stage 618 and re-arranged bits $r_{p,1}, r_{p,2}, r_{p,3}, \ldots, r_{p,U}$ are further mapped at a physical channel mapping stage 619. The resulting mapped bits are finally output to physical channel #1, physical channel #2, ..., physical channel #P. In current HS-DSCH design, only one 24-bit CRC is generated for the whole transport block for the purpose of error detection for that block. If multiple code blocks are generated and transmitted in one TTI, the receiver may correctly decode some of the code blocks but not the others. In that case, the receiver has to feedback a NACK to the transmitter because the CRC for the transport block will not check.

The HARQ functionality matches the number of bits at the output of the channel coder (i.e. channel coding stage 614) to the total number of bits of the HS-PDSCH set to which the HS-DSCH is mapped. The hybrid ARQ functionality is controlled by redundancy version (RV) parameters. The exact set of bits at the output of the hybrid ARQ functionality depends on the number of input bits, the number of output bits, and the RV parameters.

Figure 10:
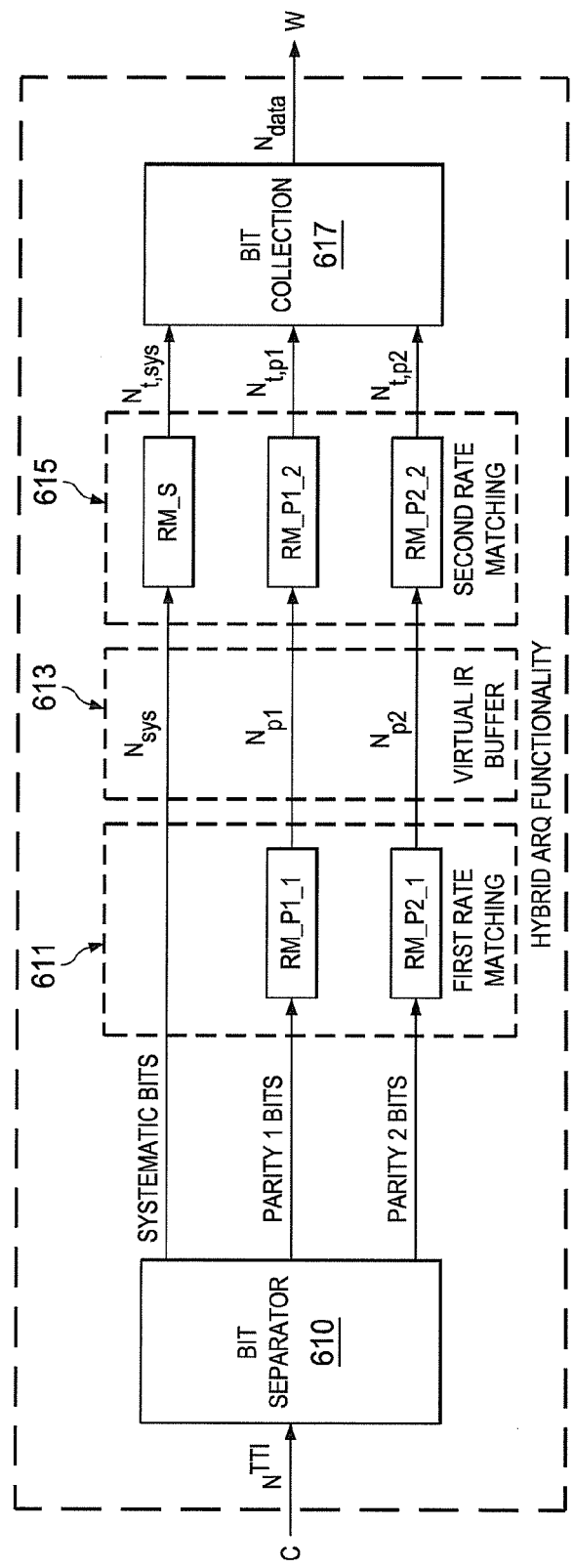
FIG. 10 is an illustration of the functionality of HS-DSCH HARQ in HSDPA.

The HARQ functionality has two rate-matching stages and a virtual buffer as shown in FIG. 10. A stream of data bits $N^{TTI}$ from resource C is separated into systematic bits, parity1 bits and parity2 bits by a bit separator 610. These three groups of bits are processed differently at a first rate matching stage 611. First rate matching stage 611 matches the number of input bits to a virtual IR buffer 613, and the information about buffer 613 is provided by higher layers. Systematic bits are directly provided to buffer 613, parity1 bits are processed by rate matcher RM_P1_1 and parity2 bits are processed by rate matcher RM_P2_1. Outputs of buffer 613 are provided to a second rate matching stage 615. Second rate matching stage 615 matches the number of bits after first rate matching stage 611 to the number of physical channel bits available in the HS-PDSCH set in the Transmission Time Interval (TTI). Output $N_{sys}$ is provided to rate matcher RM_S of second rate matching stage 615, output $N_{p1}$ is provided to rate matcher RM_P1_2 of second rate matching stage 615, and output $N_{p2}$ is provided to rate matcher RM_P2_2 of second rate matching stage 615. Outputs $N_{sys}$, $N_{p1}$ and $N_{p2}$ are provided to a bit collection stage 617. Therefore, a resulting data bits stream $N_{data}$ is provided to terminal W. Note that, if the number of input bits does not exceed buffering capability virtual IR buffer 613, first rate-matching stage 611 is transparent.

Different modulation schemes, such as Quadrature phase shift keying (QPSK), binary phase shift keying (BPSK), 8 Phase-shift keying (8-PSK), 16 Quadrature amplitude modulation (16-QAM), or 64 Quadrature amplitude modulation (64-QAM) may be used for an adaptive modulation and increasing the spectral efficiency of modulation. In case of 16-QAM modulation, quadruples of bits, $b_0b_1b_2b_3$, are mapped to complex-valued modulation symbols $x=I+jQ$. One implementation of 16-QAM is illustrated in TABLE 1:

TABLE 1

16-QAM modulation mapping

| $b_0b_1b_2b_3$ | I | Q |
|---|---|---|
| 0000 | $1/\sqrt{10}$ | $1/\sqrt{10}$ |
| 0001 | $1/\sqrt{10}$ | $3/\sqrt{10}$ |
| 0010 | $3/\sqrt{10}$ | $1/\sqrt{10}$ |
| 0011 | $3/\sqrt{10}$ | $3/\sqrt{10}$ |
| 0100 | $1/\sqrt{10}$ | $-1/\sqrt{10}$ |
| 0101 | $1/\sqrt{10}$ | $-3/\sqrt{10}$ |
| 0110 | $3/\sqrt{10}$ | $-1/\sqrt{10}$ |
| 0111 | $3/\sqrt{10}$ | $-3/\sqrt{10}$ |
| 1000 | $-1/\sqrt{10}$ | $1/\sqrt{10}$ |
| 1001 | $-1/\sqrt{10}$ | $3/\sqrt{10}$ |
| 1010 | $-3/\sqrt{10}$ | $1/\sqrt{10}$ |
| 1011 | $-3/\sqrt{10}$ | $3/\sqrt{10}$ |
| 1100 | $-1/\sqrt{10}$ | $-1/\sqrt{10}$ |
| 1101 | $-1/\sqrt{10}$ | $-3/\sqrt{10}$ |
| 1110 | $-3/\sqrt{10}$ | $-1/\sqrt{10}$ |
| 1111 | $-3/\sqrt{10}$ | $-3/\sqrt{10}$ |

Figure 11:
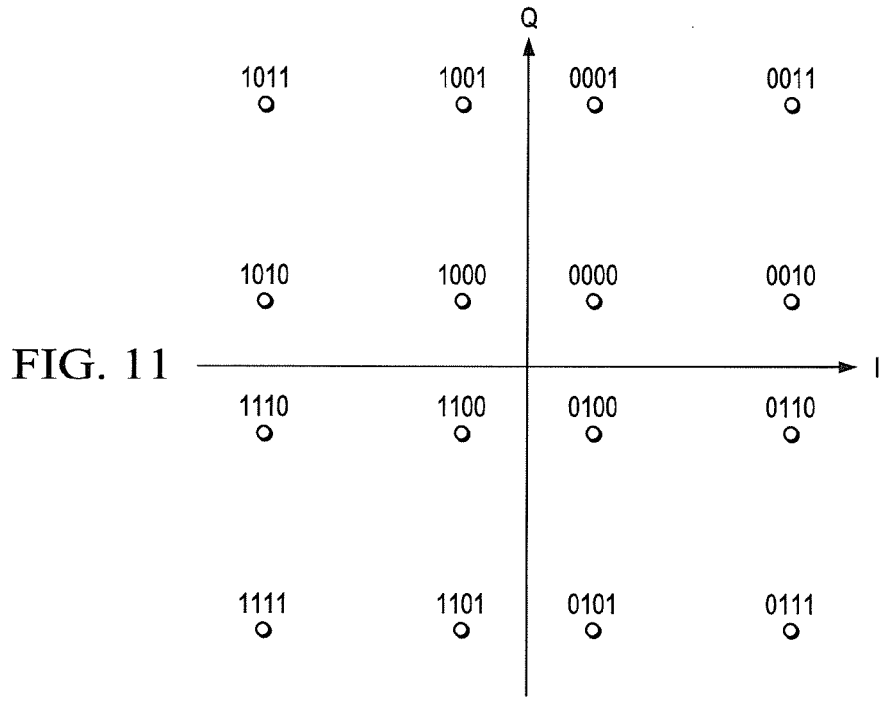
FIG. 11 shows a two dimensional coordinate which shows one illustration of 16-Quadrature Amplitude Modulation (QAM) constellation diagram.

The constellation of the 16-QAM modulation in TABLE 1 is shown in FIG. 11. FIG. 11 shows a two dimensional coordinate which shows one illustration of 16-QAM constellation diagram. A constellation diagram is a representation of a signal modulated by a digital modulation scheme. The constellation diagram displays signals on a two-dimensional coordinate diagram in a complex plane at symbol sampling instants. The constellation diagram represents the possible symbols selected by a given modulation scheme as dots in the complex plane. Each dot on FIG. 11 illustrates a corresponding symbol of $b_0b_1b_2b_3$ on the I-Q complex plan when I and Q have predetermined values as show in TABLE 1. This constellation provides different protection levels on the four bits (i.e. bit $b_0$, $b_1$, $b_2$ and $b_3$). As shown in FIG. 11, the protection level on bits $b_0$ and $b_1$ are the same, the protection level on bits $b_2$ and $b_3$ are the same. The protection level on $b_0$ and $b_1$, however, are higher than the protection level on bits $b_2$ and $b_3$.

Figure 12:
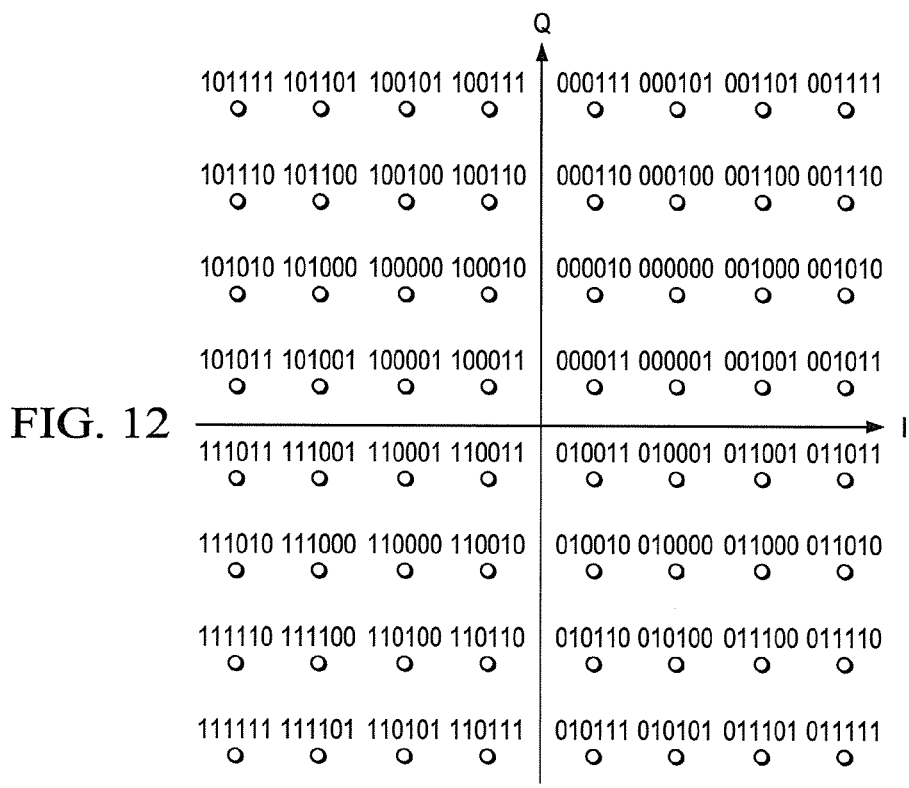
FIG. 12 shows a two dimensional coordinate which shows one illustration of 64-QAM constellation diagram.

In case of 64QAM modulation, sextuplets of bits, $b_0b_1b_2b_3b_4b_5$, are mapped to complex-valued modulation symbols $x=I+jQ$. One implementation of 64-QAM is shown in TABLE 2. The constellation of the 64-QAM modulation in TABLE 2 is shown in FIG. 11. FIG. 12 shows a two dimensional coordinate which shows one illustration of 64-QAM constellation diagram. This constellation provides different protection levels on the six bits. Similar to FIG. 11, each dot on FIG. 12 illustrates a corresponding symbol of $b_0b_1b_2b_3b_4b_5$ on the I-Q complex plane when I and Q have predetermined values as show in TABLE 2. The protection level on bits $b_0$ and $b_1$ are the same, the protection on bits $b_2$ and $b_3$ are the same, and the protection level on bits $b_4$ and $b_5$ are the same. The protection levels on bits $b_0$ and $b_1$, however, are stronger than the protection levels on bits $b_2$ and $b_3$ that are stronger than the protection on bits $b_4$ and $b_5$. For convenience, the index of a bit is defined in a modulation symbol as the modulation position of that bit.

TABLE 2

64-QAM modulation mapping

| $b_0b_1b_2b_3b_4b_5$ | I | Q |
|---|---|---|
| 000000 | $3/\sqrt{42}$ | $3/\sqrt{42}$ |
| 000001 | $3/\sqrt{42}$ | $1/\sqrt{42}$ |
| 000010 | $1/\sqrt{42}$ | $3/\sqrt{42}$ |
| 000011 | $1/\sqrt{42}$ | $1/\sqrt{42}$ |
| 000100 | $3/\sqrt{42}$ | $5/\sqrt{42}$ |
| 000101 | $3/\sqrt{42}$ | $7/\sqrt{42}$ |
| 000110 | $1/\sqrt{42}$ | $5/\sqrt{42}$ |
| 000111 | $1/\sqrt{42}$ | $7/\sqrt{42}$ |
| 001000 | $5/\sqrt{42}$ | $3/\sqrt{42}$ |
| 001001 | $5/\sqrt{42}$ | $1/\sqrt{42}$ |
| 001010 | $7/\sqrt{42}$ | $3/\sqrt{42}$ |
| 001011 | $7/\sqrt{42}$ | $1/\sqrt{42}$ |
| 001100 | $5/\sqrt{42}$ | $5/\sqrt{42}$ |
| 001101 | $5/\sqrt{42}$ | $7/\sqrt{42}$ |
| 001110 | $7/\sqrt{42}$ | $5/\sqrt{42}$ |
| 001111 | $7/\sqrt{42}$ | $7/\sqrt{42}$ |
| 010000 | $3/\sqrt{42}$ | $-3/\sqrt{42}$ |
| 010001 | $3/\sqrt{42}$ | $-1/\sqrt{42}$ |
| 010010 | $1/\sqrt{42}$ | $-3/\sqrt{42}$ |
| 010011 | $1/\sqrt{42}$ | $-1/\sqrt{42}$ |
| 010100 | $3/\sqrt{42}$ | $-5/\sqrt{42}$ |
| 010101 | $3/\sqrt{42}$ | $-7/\sqrt{42}$ |
| 010110 | $1/\sqrt{42}$ | $-5/\sqrt{42}$ |
| 010111 | $1/\sqrt{42}$ | $-7/\sqrt{42}$ |
| 011000 | $5/\sqrt{42}$ | $-3/\sqrt{42}$ |
| 011001 | $5/\sqrt{42}$ | $-1/\sqrt{42}$ |
| 011010 | $7/\sqrt{42}$ | $-3/\sqrt{42}$ |
| 011011 | $7/\sqrt{42}$ | $-1/\sqrt{42}$ |
| 011100 | $5/\sqrt{42}$ | $-5/\sqrt{42}$ |
| 011101 | $5/\sqrt{42}$ | $-7/\sqrt{42}$ |
| 011110 | $7/\sqrt{42}$ | $-5/\sqrt{42}$ |
| 011111 | $7/\sqrt{42}$ | $-7/\sqrt{42}$ |
| 100000 | $-3/\sqrt{42}$ | $3/\sqrt{42}$ |
| 100001 | $-3/\sqrt{42}$ | $1/\sqrt{42}$ |
| 100010 | $-1/\sqrt{42}$ | $3/\sqrt{42}$ |
| 100011 | $-1/\sqrt{42}$ | $1/\sqrt{42}$ |
| 100100 | $-3/\sqrt{42}$ | $5/\sqrt{42}$ |
| 100101 | $-3/\sqrt{42}$ | $7/\sqrt{42}$ |
| 100110 | $-1/\sqrt{42}$ | $5/\sqrt{42}$ |
| 100111 | $-1/\sqrt{42}$ | $7/\sqrt{42}$ |
| 101000 | $-5/\sqrt{42}$ | $3/\sqrt{42}$ |
| 101001 | $-5/\sqrt{42}$ | $1/\sqrt{42}$ |
| 101010 | $-7/\sqrt{42}$ | $3/\sqrt{42}$ |
| 101011 | $-7/\sqrt{42}$ | $1/\sqrt{42}$ |
| 101100 | $-5/\sqrt{42}$ | $5/\sqrt{42}$ |
| 101101 | $-5/\sqrt{42}$ | $7/\sqrt{42}$ |
| 101110 | $-7/\sqrt{42}$ | $5/\sqrt{42}$ |
| 101111 | $-7/\sqrt{42}$ | $7/\sqrt{42}$ |
| 110000 | $-3/\sqrt{42}$ | $-3/\sqrt{42}$ |
| 110001 | $-3/\sqrt{42}$ | $-1/\sqrt{42}$ |
| 110010 | $-1/\sqrt{42}$ | $-3/\sqrt{42}$ |
| 110011 | $-1/\sqrt{42}$ | $-1/\sqrt{42}$ |
| 110100 | $-3/\sqrt{42}$ | $-5/\sqrt{42}$ |
| 110101 | $-3/\sqrt{42}$ | $-7/\sqrt{42}$ |
| 110110 | $-1/\sqrt{42}$ | $-5/\sqrt{42}$ |
| 110111 | $-1/\sqrt{42}$ | $-7/\sqrt{42}$ |
| 111000 | $-5/\sqrt{42}$ | $-3/\sqrt{42}$ |
| 111001 | $-5/\sqrt{42}$ | $-1/\sqrt{42}$ |
| 111010 | $-7/\sqrt{42}$ | $-3/\sqrt{42}$ |
| 111011 | $-7/\sqrt{42}$ | $-1/\sqrt{42}$ |
| 111100 | $-5/\sqrt{42}$ | $-5/\sqrt{42}$ |
| 111101 | $-5/\sqrt{42}$ | $-7/\sqrt{42}$ |
| 111110 | $-7/\sqrt{42}$ | $-5/\sqrt{42}$ |
| 111111 | $-7/\sqrt{42}$ | $-7/\sqrt{42}$ |

For example, the modulation position of $b_0$ in a 64-QAM is 0, the modulation position of $b_1$ in a 64-QAM is 1. Therefore, for the given 64-QAM constellation, the first and second modulation positions, i.e., $b_0$ and $b_1$, have the strongest protection; the third and fourth modulation positions, i.e., $b_2$ and $b_3$, have weaker protection levels; the fifth and the sixth modulation positions, i.e., $b_4$ and $b_5$, have the weakest protection level.

In this disclosure, methods and apparatus are provided to improve the performance of transmissions with information bits or parity bits from multiple coded packets.

Aspects, features, and advantages of the disclosure are readily apparent from the following detailed description, simply by illustrating a number of particular embodiments and implementations, including the best mode contemplated for carrying out the disclosure. The present disclosure is also capable of other and different embodiments, and several details of the systems and methods of the present disclosure may be modified into various obvious respects, all without departing from the spirit and scope of the disclosure. Accordingly, the drawings and description are to be regarded as illustrative in nature, and not as restrictive. The present disclosure is illustrated by way of example, and not by way of limitation, in the figures of the accompanying drawings.

In the following illustrations, the downlink data channel in LTE systems are used as an example. However, the technique illustrated here can certainly be used in uplink data channel in LTE systems, control channels in either downlink or uplink in LTE systems, and other data, control, or other channels in other systems whenever applicable.

In the present disclosure, an improved design of channel interleaver and receiver is provided and a separate coding method of multiple code blocks is taken into account to improve the performance. When multiple code blocks are transmitted, the performance of the transmission is dictated by the code block that has the worst performance. The idea is to carefully design the channel interleaver, including the mapping from coded bits of different code blocks to modulation symbols, and the mapping from modulation symbols to time, frequency, and spatial resources, to make sure each code block get roughly the same level of protection. On the receiver side, when some code blocks are received correctly and some are not, the signal of the successfully decoded code blocks may be reconstructed and cancelled from the received signal. After the cancellation, the receiver may attempt to re-decode the other code blocks. Because the interference with other code blocks that are not yet successfully decoded may be greatly reduced, the probability that the receiver will be able to decode the other code blocks can be significantly increased. In the case of HARQ, if the receiver is not able to decode one of the code blocks, the receiver will feedback NACK for the whole transport block, assuming there is only one ACK channel. Because the Node B has no knowledge which code block is successfully decoded by the UE and which is not, the Node B will retransmit as if the whole transport block including all code blocks are NACKed. In that case, UE should be able to utilize the knowledge about those successfully decoded code blocks to help decoding those code blocks that have not been successfully decoded. The channel interleaver design proposed in this disclosure facilitates that operation. Preferred embodiments of the receiver operation are also disclosed.

Figure 13:
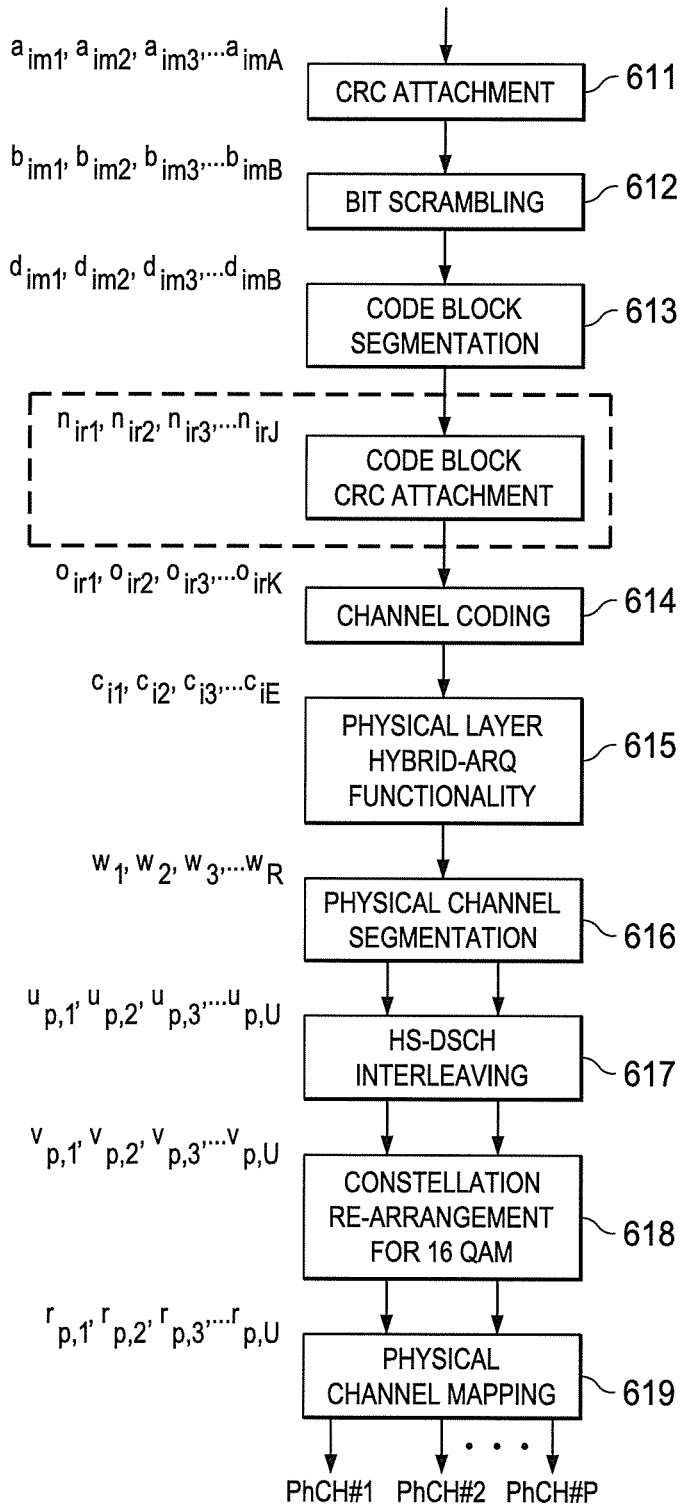
FIG. 13 shows an example of the attachment of code block CRC suitable for the practice of the principles of one embodiment of the present disclosure.

In one embodiment of the disclosure, a CRC is added to each code block to enable error detection for each code block. FIG. 13 shows an example of the attachment of code block CRC. Comparing to FIG. 9, after the transport block CRC attachment, the bit scrambling, and the code block segmentation, an additional step of attaching code block CRC to at least one of the code blocks follows immediately after the step of code clock segmentation as shown in FIG. 13. The transport block is segmented into one or multiple code blocks. If there is only one code block in the transport block, the code block CRC may not be necessary. If there is more than one code block in the transport block, the attachment of code block CRC becomes important. As an example, the transport block CRC for HS-DSCH in HSDPA is 24-bit, which provides very low detection error (about $2^{-24} \approx 6 \times 10^{-8}$). One purpose of attaching CRC to each code block is to provide sufficient code block error detection so that the receiver can cancel the signals of those code blocks that are correctly decoded. A CRC detection error of $\sim 10^{-8}$ may be sufficient for this operation. Note that an 8-bit CRC can provide a detection error rate of about $4 \times 10^{-3}$. In this case, an 8-bit CRC may be used for code block CRC for code block error detection and cancellation, while a 24-bit CRC may be used for transport block error detection. By doing so, the CRC overhead is minimized while providing means to facilitate cancellation of successfully decoded code blocks. Obviously, the CRC overhead can be further reduced by only attaching one code block CRC for multiple code blocks.

In the present disclosure, a number of steps are provided to be applied in channel interleaver design. Note that not all of these steps need to be incorporated in order to use this disclosure. In other words, the present disclosure covers the interleavers and interleaving methods that use at least one of the steps illustrated in this disclosure. Note that the constellation re-arrangement for 16-QAM as shown in FIG. 13 may not be necessary with the proposed channel interleaver design.

Figure 14:
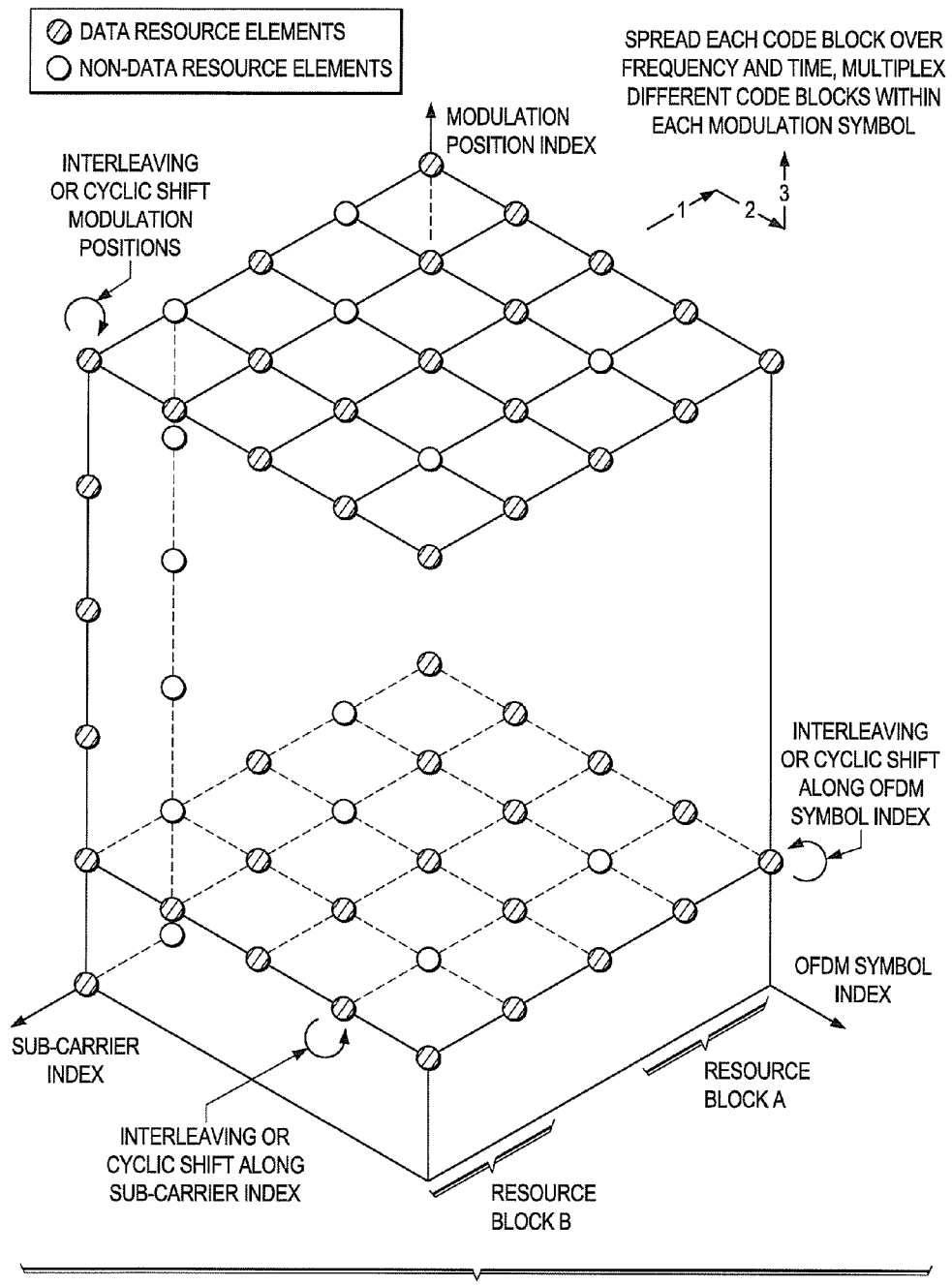
FIG. 14 illustrates channel interleaver for OFDM systems suitable for the practice of the principles of another embodiment of the present disclosure.
Figure 15:
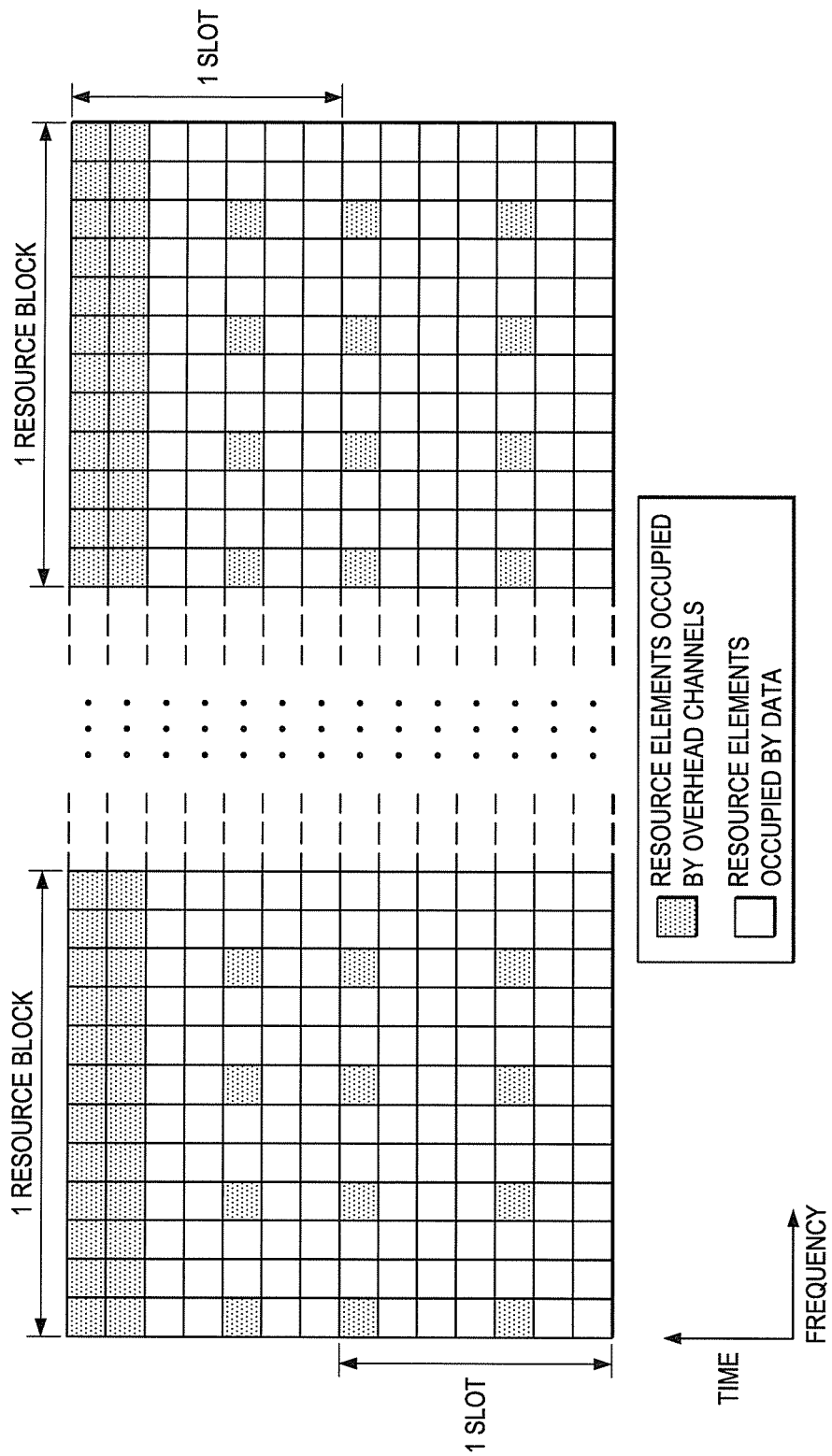
FIG. 15 illustrates a resource element map for a data transmission suitable for the practice of the principles of another embodiment of the present disclosure.
Figure 16:
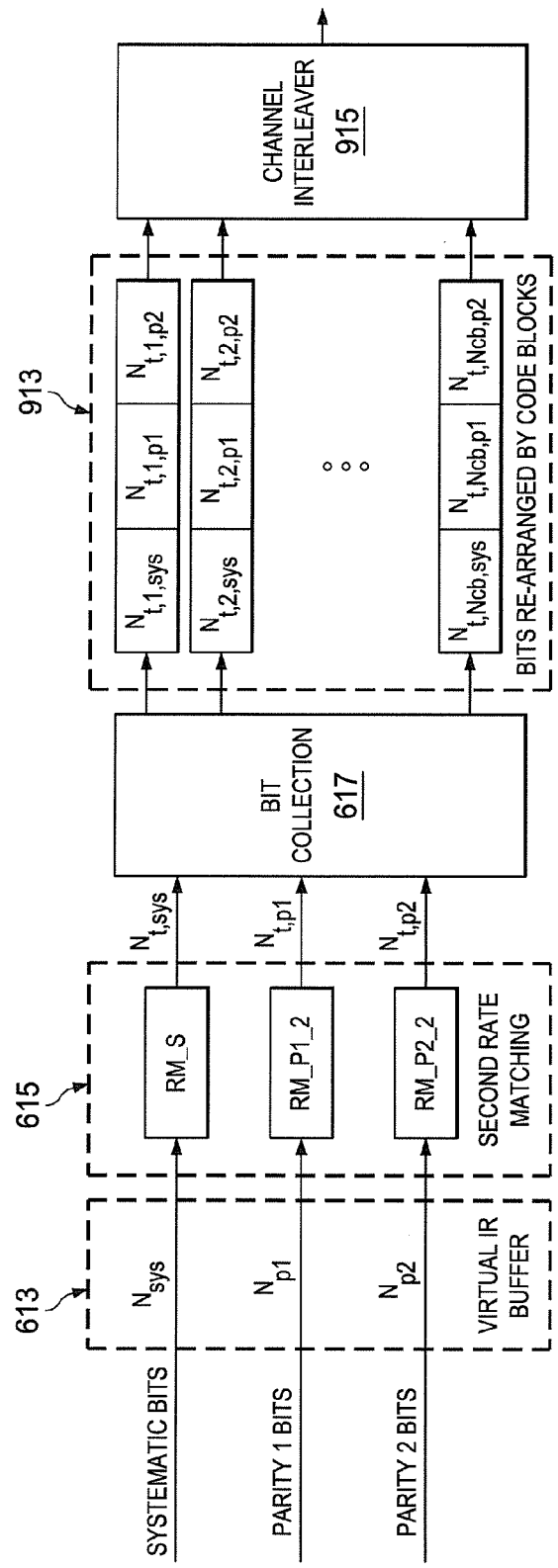
FIG. 16 shows a re-arrangement of coded bits by code blocks after rate matching suitable for the practice of the principles of another embodiment of the present disclosure.

Turning now to FIG. 14, FIG. 15 and FIG. 16, FIG. 14 illustrates channel interleaver for Orthogonal Frequency Division Multiplexing (OFDM) systems suitable for the practice of the principles of one embodiment of the present disclosure. FIG. 15 illustrates a resource element map for a data transmission suitable for the practice of the principles of one embodiment of the present disclosure. FIG. 16 shows a re-arrangement of coded bits by code blocks after rate matching suitable for the practice of the principles of one embodiment of the present disclosure. As shown in FIG. 14, the resource allocated to a data transmission is N OFDM symbols in time, and M sub-carriers in frequency. Each sub-carrier of one OFDM symbol is called one resource element. Resource elements include data resource elements and non-data resource elements. Each resource element carries a modulation symbol, which in turn carries multiple coded bits. For example, 2 bits can be carried in one QPSK modulation symbol; 4 bits can be carried in one 16-QAM modulation symbol, etc. The number of bits carried in each modulation symbol is denoted as a modulation order L, each modulation position in a modulation symbol is represented by one modulation position index as shown in FIG. 14. One preferred embodiment of the channel interleaver design consists at least one of the following operations.

Step 1

First, for each code block, symbols S, $P_1$, $P_2$, are, respectively, the systematic bits, parity bits from encoder 1 of a turbo encoder, and parity bits from encoder 2 of the turbo encoder. A turbo encoder is formed by parallel concatenation of two recursive systematic convolutional (RSC) encoders separated by an interleaver. In one embodiment of the present disclosure, the coded bits after the second rate matching are re-arranged based on code blocks. As illustrated in FIG. 16, there are a number of $N_{cb}$ code blocks in transmission for this transport block. Comparing to FIG. 10, a stage 913 called bits re-arrangement by code blocks immediately follows bit collection stage 617. In stage 913, the systematic bits, parity 1 bits, and parity 2 bits of code block 1 are collected together and arranged in the order of S, $P_1$, $P_2$. The number of systematic bits, parity 1 bits, and parity 2 bits of the i-th code block are denoted by $N_{t,i,sys}$, $N_{t,i,p1}$, $N_{t,1,p2}$, respectively. The re-arranged bits then enter a stage 915, which is called channel interleaver stage. $N_{t,1,sys}$, $N_{t,i,p1}$, $N_{t,1,p2}$ may be presented as following equations respectively.

$$N_{t,sys} = \sum_{i=1}^{N_{cb}} N_{t,i,sys} \quad (1)$$

$$N_{t,p1} = \sum_{i=1}^{N_{cb}} N_{t,i,p1} \quad (2)$$

$$N_{t,p2} = \sum_{i=1}^{N_{cb}} N_{t,i,p2} \quad (1)$$

The re-arranged bits can be used to fill up the time-frequency resources, and the modulation positions in modulation symbols.

Step 2

Secondly, these bits are written into a three-dimensional space as shown in FIG. 14. These bits first fill up the space along the dimension of frequency (i.e. sub-carrier) index. Then they fill up the space along the dimension of time (i.e. OFDM symbol) index. At last they fill up the space along the dimension of modulation position index. Note other ordering of dimensions is certainly possible and covered by the present disclosure. Each position in the three dimensional space may be represented by a coordinate (b, t, f). If the first bit is placed at (0, 0, 0), then the second bit should be placed at (0, 0, 1), the third bit should be placed at (0, 0, 2), etc. After the frequency dimension is exhausted for a given OFDM symbol index, the OFDM symbol index is increased. For example, the (M−1)-th bit should be placed at (0, 0, M−1), and the M-th bit may be placed at (0, 1, 0). After the frequency and time indices are exhausted, the modulation position index is increased. For example, the (MN−1)-th bit should be placed at (0, N−1, M−1), and the MN-th bit should be placed at (1, 0, 0). Note there might be some resource elements punctured or occupied by other channels and thus are not available to the data channel transmission. In a preferred embodiment of this disclosure, the time-frequency resources with a resource element map are represented in FIG. 15. The resource elements assigned to a data transmission are grouped together to form a resource element map. The map shows the resource elements available to data transmission and resource elements that are occupied by other channels such as reference signal, downlink control channels, etc. The resource elements occupied by other channels are skipped. Note this resource element map can be reused for each modulation position, as shown in FIG. 15. Eventually, the space that accommodates the coded bits can be described as a cube as shown in FIG. 14, with some resource elements taken by other channels and these taken resource elements are called non-data resource elements.

Step 3

Thirdly, for each modulation position index and each OFDM symbol, the data bits are interleaved along the frequency dimension. For example, a BRO interleaver or a pruned BRO interleaver may be used, or any other interleaver may be used for this purpose. Sometimes, one or multiple of simplified shuffling patterns may be used. For example, cyclic shifts, or predetermined interleaving/re-arrangement/shuffling/swapping patterns may be used. These patterns may or may not change for each OFDM symbol and/or each modulation position index. Sometimes the number of resource elements available in each OFDM symbol may be different due to different amount of puncturing or usage by other channels in these OFDM symbols. In that case, interleaver with different sizes may be used on different OFDM symbols.

Step 4

Fourth, for each modulation position index and each sub-carrier, the data bits are interleaved along the time dimension. For example, a BRO interleaver or a pruned BRO interleaver may be used, or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each modulation position and/or sub-carrier index. Sometimes, the number of resource elements available on each sub-carrier index may be different due to different amount of puncturing or usage by other channels on this sub-carrier. In that case, interleaver with different sizes may be used on different sub-carriers.

Step 5

Fifth, for each sub-carrier and each OFDM symbol, the data bits are interleaved along the dimension of modulation position index. For example, a BRO interleaver or a pruned BRO interleaver may be used, or any other interleaver can be used for this purpose. Sometimes, one or multiple of simplified shuffling patterns can be used. For example, cyclic shifts, or predetermined interleaving/re-arrangement/shuffling/swapping patterns can be used. These patterns may or may not change for each sub-carrier and/or each OFDM symbol. Preferred patterns will be explained later in the present disclosure.

One preferred embodiment of the channel interleaver design consists at least one of the above-stated five steps.

Figure 19:
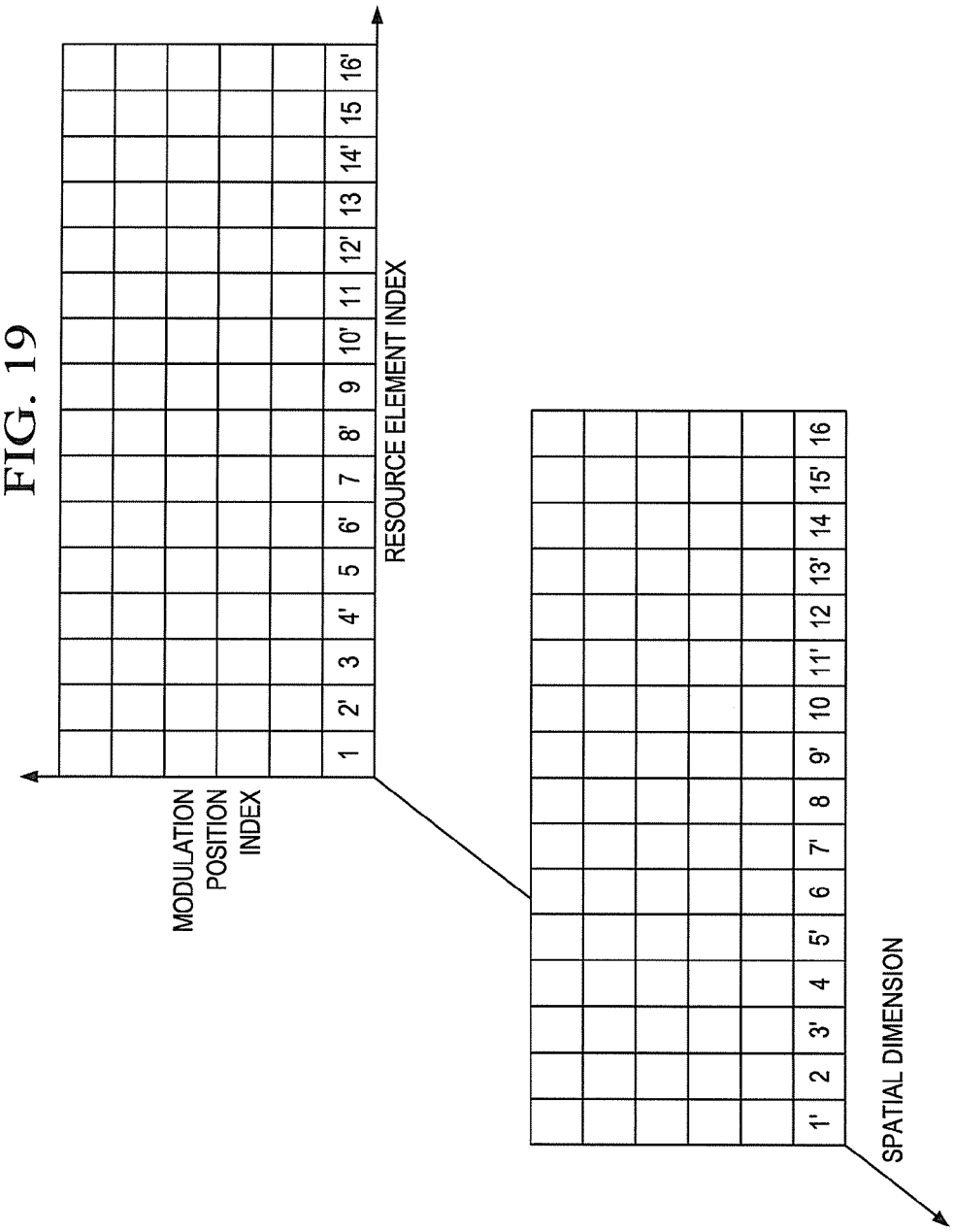
FIG. 19 shows an example of spreading the coded bits of a code block over time, frequency, and spatial domains suitable for the practice of the principles of another embodiment of the present disclosure.

In the following description, embodiments and variations to the aforementioned steps are disclosed. Note these embodiments only describe one or multiple intermediate steps of the whole interleaving process. Particularly, pictorial illustrations used only show the effect of one or multiple intermediate steps and may not reflect the final outcome of the interleaving process. For example, FIG. 19 shows the coded bits of a code block are spread over time, frequency, and spatial domain. The coded bits of the code block, however, are all in the first modulation position of all the modulation symbols. Subsequent interleaving steps will interleave these coded bits in time, frequency, and spatial dimension, and will shift the modulation positions of these coded bits in modulation symbols.

Steps 1 and 2 attempt to spread the coded bits of each code block in frequency and time domains as much as possible to maximize frequency and time diversity. For LTE systems, frequency diversity is normally more pronounced than time diversity within one transmission. Therefore, it is preferable to first increase the frequency sub-carrier index and then increase the OFDM symbol index. Different ordering of increasing the indices of different dimensions is certainly covered by the present disclosure. Normally forward error correction codes, especially when implemented with practical decoders, handle separated or random errors better than burst or contiguous errors. Step 3 transfers burst errors in frequency domain into separated errors. Step 4 transfers burst errors in time domain into separated errors. For higher order modulation, each modulation position within a modulation symbol may enjoy different protection. Step 5 attempts to randomize or uniformly distribute the bits of each code block into different modulation positions of modulation symbols so that on average coded bits of each code block enjoys the same level of protection. The order of Step 3, Step 4, and Step 5 may be changed without escaping the idea of the present disclosure. Certain steps may also be combined into a single step. For example, Step 2 and Step 5 may be easily combined by jumping to a different modulation position as frequency and time indices change.

There are many alternative implementations to Steps 2, 3, and 4 that achieve similar effects in spreading the coded bits of each code blocks into time-frequency domain. In one embodiment of the disclosure, some other two-dimension matrices may be used to represent the time-frequency resources instead of the resource element map. For example, a two-dimension matrix with the number of rows equal to the number of resource blocks and the number of columns equal to the number of resource elements available for data in each resource block can be used. Suppose the data transmission is assigned as a number of $N_{block}$ resource blocks, and there are a number of $N_{DataRE}$ bits available for data transmission in each resource block, then the coded bits may be placed into the $L \times N_{block} \times N_{DataRE}$ space. Preferably, the block index increases first, then the resource element index, then the modulation position index. By doing so, the adjacent coded bits are separated into different resource blocks which are likely to experience different channel conditions. The same operation may also be described as a row-column interleaving/permutation with a size of $N_{block} \times N_{DataRE}$ applied on each modulation position, or as a row-column interleaving/permutation with the size of $N_{block} \times N_{DataRE}$ applied on modulation symbols. On each modulation position, the coded bits are written into a matrix $N_{block} \times N_{DataRE}$ with the block index increases first. Interleaving along the block index or the data resource element (RE) index can certainly be performed, if desired. The purpose of interleaving along the block index is to randomize the location of coded bits into blocks that are far apart. The purpose of interleaving along the data RE index is to randomize the location of coded bits within a resource block. At last, when these bits are mapped to time-frequency resources, they are read out and placed on time-frequency resources with the resource element index increases first to achieve the effect of row-column interleaving. Again, note this operation can be applied on the whole modulation symbols instead of being applied on each modulation position.

Figure 17A:
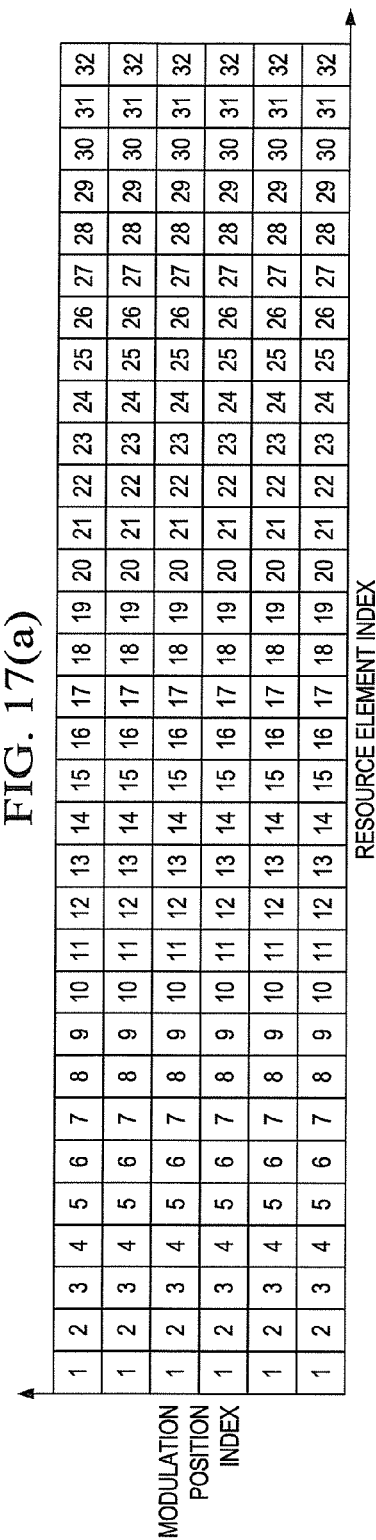
FIG. 17(a) shows the resources elements represented in one dimension suitable for the practice of the principles of another embodiment of the present disclosure.
Figure 17B:
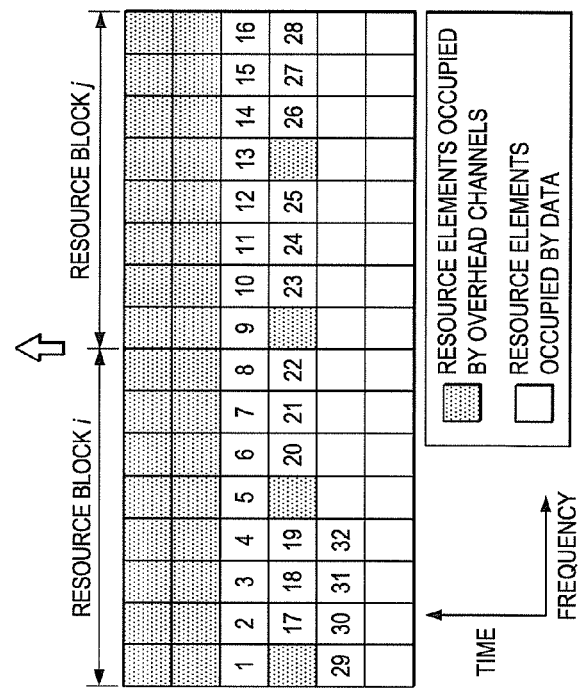
FIG. 17(b) shows a time index (OFDM symbol index)-frequency index (sub-carrier index) space for accommodating data coded bits suitable for the practice of the principles of another embodiment of the present disclosure.

Alternatively, to ease the implementation of Step 2, 3, and 4, one dimension may be employed to represent the time-frequency resources. The resource elements are indexed on the resource element map. The assignment of indices to resource elements may be arbitrary. For example, starting from the one with the lowest OFDM symbol index and the lowest sub-carrier index, the resource elements may be exhausted by first increasing the sub-carrier index and then increasing the OFDM symbol index. Alternatively, the resource elements may be exhausted by first increasing the OFDM symbol index and then increasing the sub-carrier index. One example is shown in FIG. 17(a) and FIG. 17(b). FIG. 17(b) shows a time (OFDM symbol index)-frequency (sub-carrier index) space for accommodating data coded bits, this time-frequency space is shown as one dimension in FIG. 17(a), and this dimension grows along modulation position index direction and becomes a two-dimensional matrix as shown in FIG. 17(a). The resources elements occupied by data as shown in FIG. 17(b), i.e., resources elements 1-32 are expended in the modulation position index and become a two-dimensional matrix as shown in FIG. 17(a). After the time-frequency space as shown in FIG. 17(b) is filled up by the coded bits of multiple resource blocks i, j, interleave may be done along the resource element dimension to spread adjacent coded bits in the time-frequency resources. BRO, or pruned BRO, or any other type of interleaver may be used.

Figure 18:
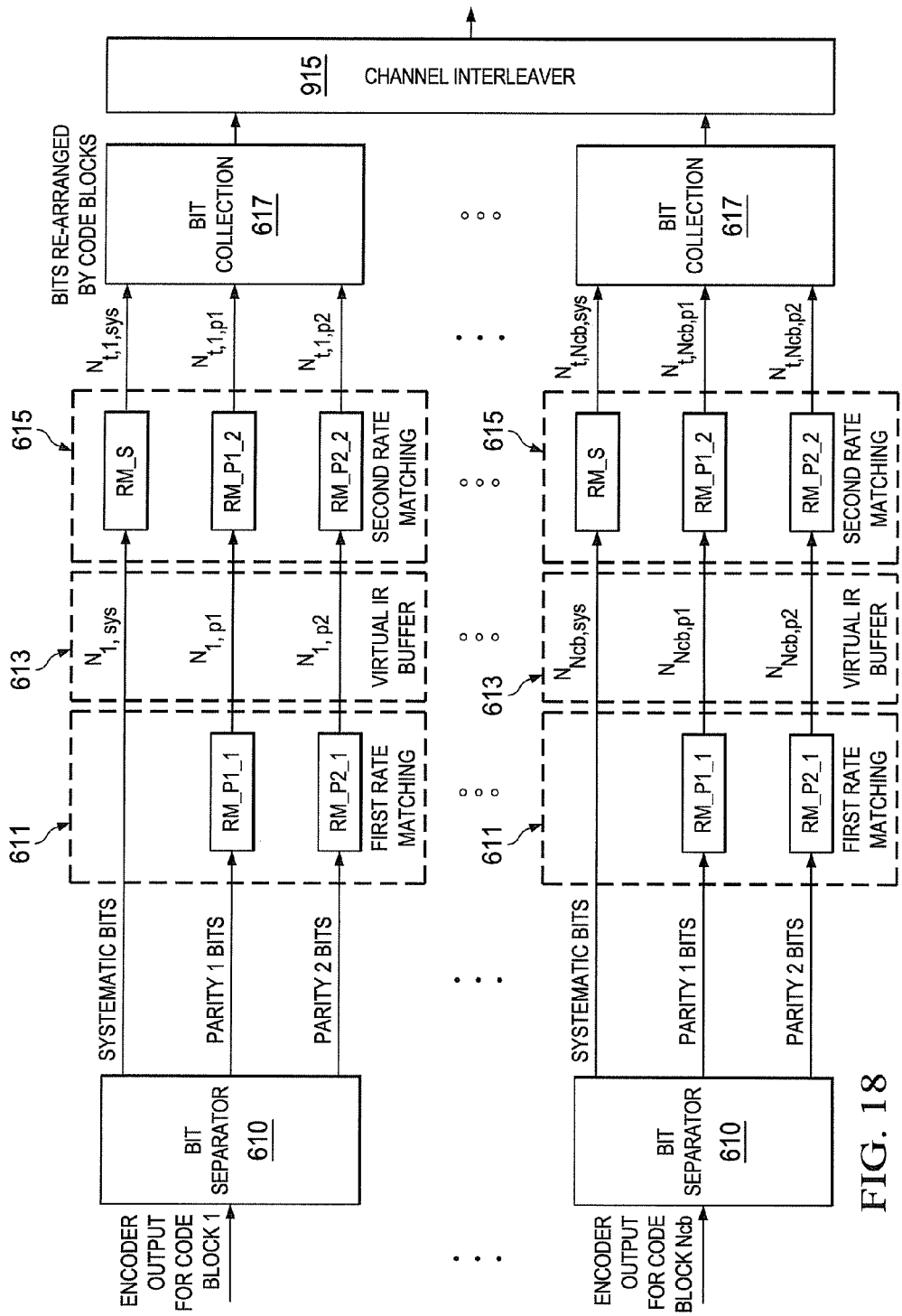
FIG. 18 shows an implementation of rate matching and bit collection on a code block basis suitable for the practice of the principles of another embodiment of the present disclosure.

Alternatively, the implementation of Step 1, 2, 3, and 4 may be more integrated with the encoding processes ahead of these steps. For example, the HSDPA system assumes the systematic bits of all code blocks are placed together followed by the parity 1 bits of all coded blocks and then followed by the parity 2 bits of all coded blocks. To group the systematic bits, parity 1 bits, and parity 2 bits of at least one code block after rate matching, this can also be achieved by performing the entire rate matching process separately for the code blocks. FIG. 18 shows an implementation of rate matching and bit collection on a code block basis. Each code block, i.e., code block 1, code block 2, . . . , code block $N_{cb}$, is processed by bit separator 610, first rate matching stage 611, virtual IR buffer 613, second rate matching stage 615 and bit collection stage 617 in a sequence. All of the re-arranged bits then enter a stage 915, which is called channel interleaver stage. For each code block, the processes are similar to the processes taught in the descriptions of FIG. 10. Therefore, detailed explanation is omitted here. In this implementation, the encoder output of at least one code block are passed through first rate matching stage 611, virtual IR buffer 613, and second rate matching stage 615 separately. So, the output of the second rate matching will naturally have the systematic bits, parity 1 bits, and parity 2 bits of the code block grouped together. Although the actual rate matching processes for multiple code blocks is done separately, the parameter and configuration of these rate matching processes for multiple code blocks may need coordination. Certainly, this disclosure covers other variants of the implementation with some steps in the rate matching process simplified, modified, or skipped, as long as the rate matching process is done on code block basis. For example, the first rate matching stage 611, virtual IR buffer 613, and second rate matching process 615 may be simplified and combined into one step which simply selects the appropriate coded bits for each transmission. For example, bit separation stage 610 and bit collection stage 617 may not be necessary if the encoder output is already grouped in to systematic bits, parity 1 bits, and parity 2 bits.

For a suboptimal though simpler implementation, Step 1 may be skipped. In this case, the systematic bits, parity 1 bits, and parity 2 bits of each code block are not grouped together. With the efforts in the rest of the interleaving steps, the coded bits of each code block are still sufficiently spread and good performance may be achieved.

The aforementioned embodiments of channel interleaver design may be easily extended to the case of MIMO transmissions. Suppose multiple layers are allocated to a MIMO codeword. This scenario may apply to LTE systems, e.g., when the SU-MIMO transmission has rank greater than 1. In this case, a spatial dimension is added in the channel interleaver design. The space for the coded bits may be described as a four-dimensional space in time, frequency, space and modulation positions. To illustrate the idea in a three-dimensional space, which allows us a pictorial presentation, the time-frequency dimension is simplified into one dimension of resource elements as shown in FIG. 17. Therefore, the space for coded bits may be represented as a three-dimensional space in resource elements, space, and modulation positions, as shown in FIG. 19. FIG. 19 illustrates spreading coded bits of each code clock over time, frequency and spatial domain. The interleaver will allocate coded bits of each code block along the space dimension first, then along the resource element dimension to make sure the code block collects maximal diversity in time, frequency, and space. Resource element index refers resource elements dimension, spatial dimension refers to space dimension, and modulation position index refers to modulation positions dimension. If multiple code blocks are transmitted, the code blocks within each of the codeword should be spread over time, frequency, and spatial domain. In FIG. 19, coded bits 1, 2, 3, . . . , 16 belong to one code block while coded bits 1', 2', 3', . . . , 16' belong to another code block.

In another embodiment of the disclosure, the aforementioned embodiments are extended to MIMO transmissions with different spatial dimensions on different resource elements.

Figure 20:
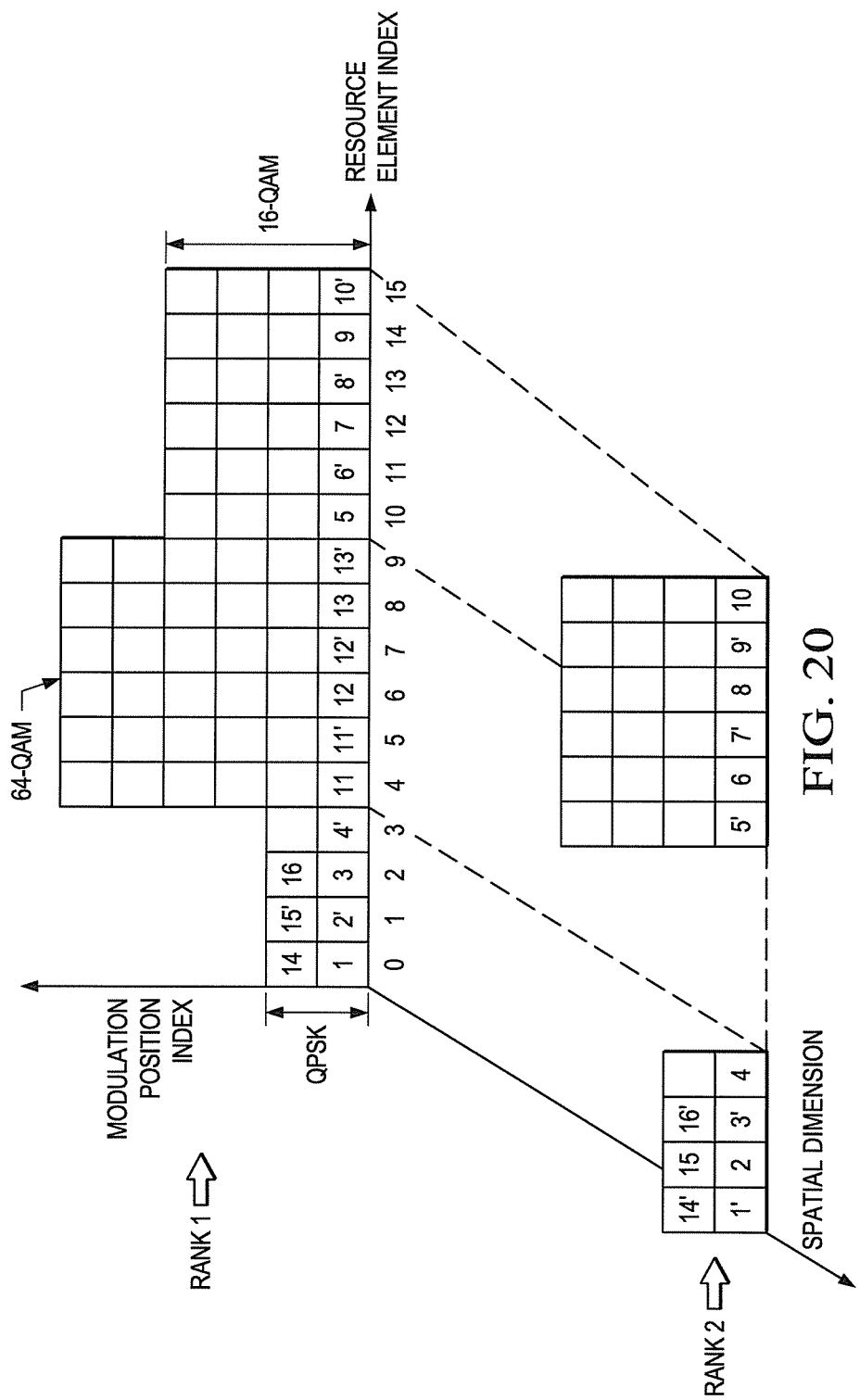
FIG. 20 shows an example of writing coded bits into resources with different layers and different modulation orders suitable for the practice of the principles of another embodiment of the present disclosure.

In a MIMO system, the rank (number of spatial dimensions, or layers) may be different on different frequency resource elements. The aforementioned embodiments may also be extended to transmissions with different modulation order on different resources. For example, if two resource blocks have very different CQI, the transmitter may use different modulation orders on these two resource blocks. In this case, the design goal of spreading coded bits of each code block as much as possible over time, frequency, spatial, and modulation positions still applies. Special handling needs to be implemented to handle the case of different spatial dimensions or different modulation orders on different time-frequency resources. For example, similar to the resource element map, a map can be constructed to include spatial and modulation position dimension. The layers or the modulation positions that are not available will be skipped. FIG. 20 shows an example of writing coded bits into resources with different layers and different modulation orders. In FIG. 20, different modulation orders such as QPSK, 16-QAM and 64-QAM are shown, and rank 2 on resource element index 0,1,2,3,10,11,12,13,14, and 15 and rank 1 on resource element index 4,5,6,7,8 and 9. In this example, the two code blocks still try to spread over spatial dimensions first, when the spatial dimension is collapsed to 1, as in resource elements 4, 5, 6, 7, 8, 9, the two code blocks will both be placed in the same layer at the spatial dimension. Each code block, however, will still be spread in time and frequency dimension (not shown in FIG. 20 because time and frequency dimensions are shown as one dimension of resource elements). After all coded bits are mapped into resource elements, other interleaving processing such as row-column interleaving, interleaving of modulation positions, can be performed to further randomize the location of coded bits.

Figure 21:
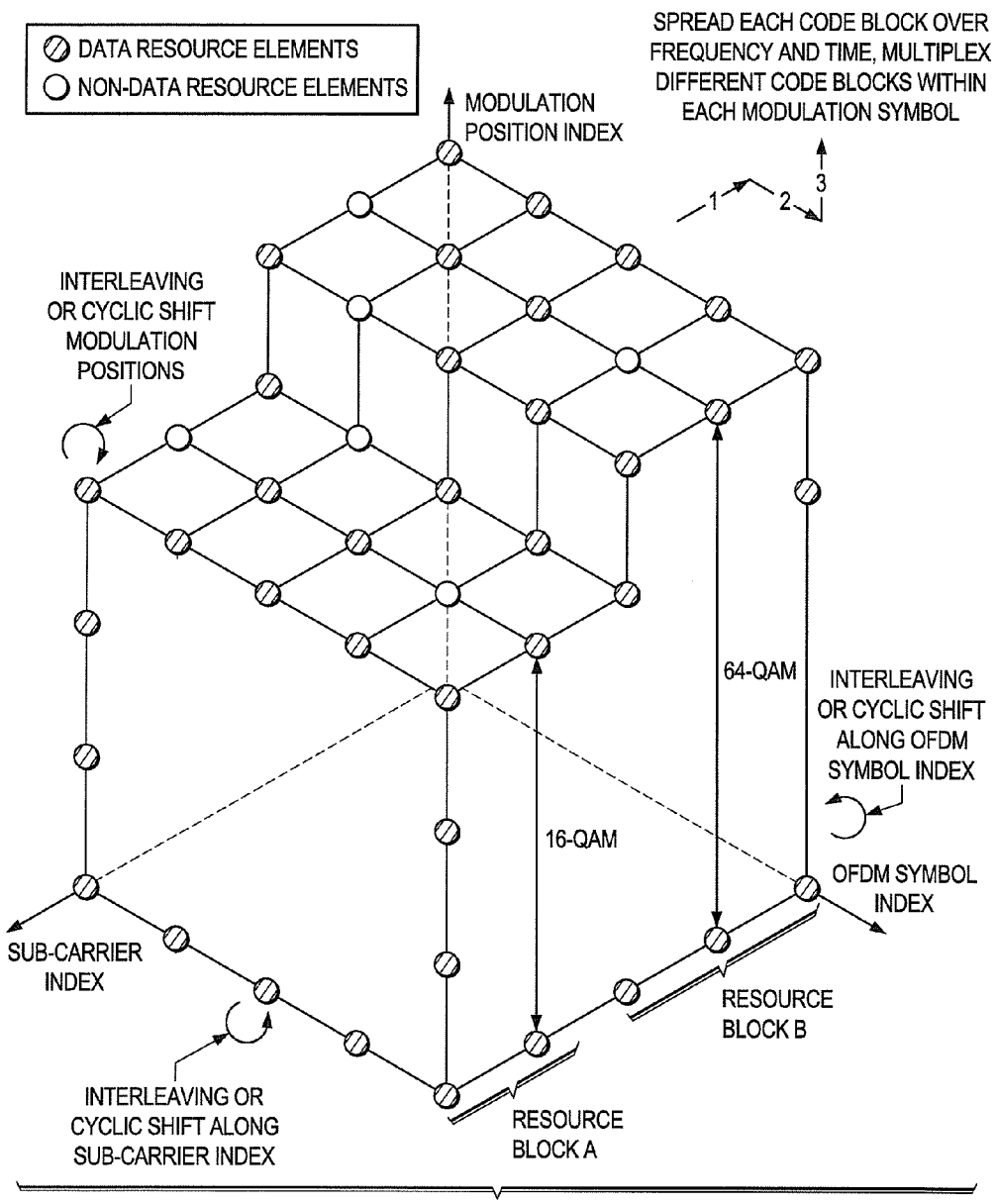
FIG. 21 illustrates channel interleaver with different modulation order on resources suitable for the practice of the principles of another embodiment of the present disclosure.

A pictorial illustration of channel interleaver when different modulation orders are used on different resources is also shown in FIG. 21. FIG. 21 illustrates channel interleaver with different modulation order on resources. In this case, resource block A uses 16-QAM while resource block B uses 64-QAM. The coded bits fill up the space defined by time, frequency, and available modulation positions on each resource elements, skipping resource elements occupied by other channels. In summary, the aforementioned interleaving steps and embodiments apply in this case.

Figure 22:
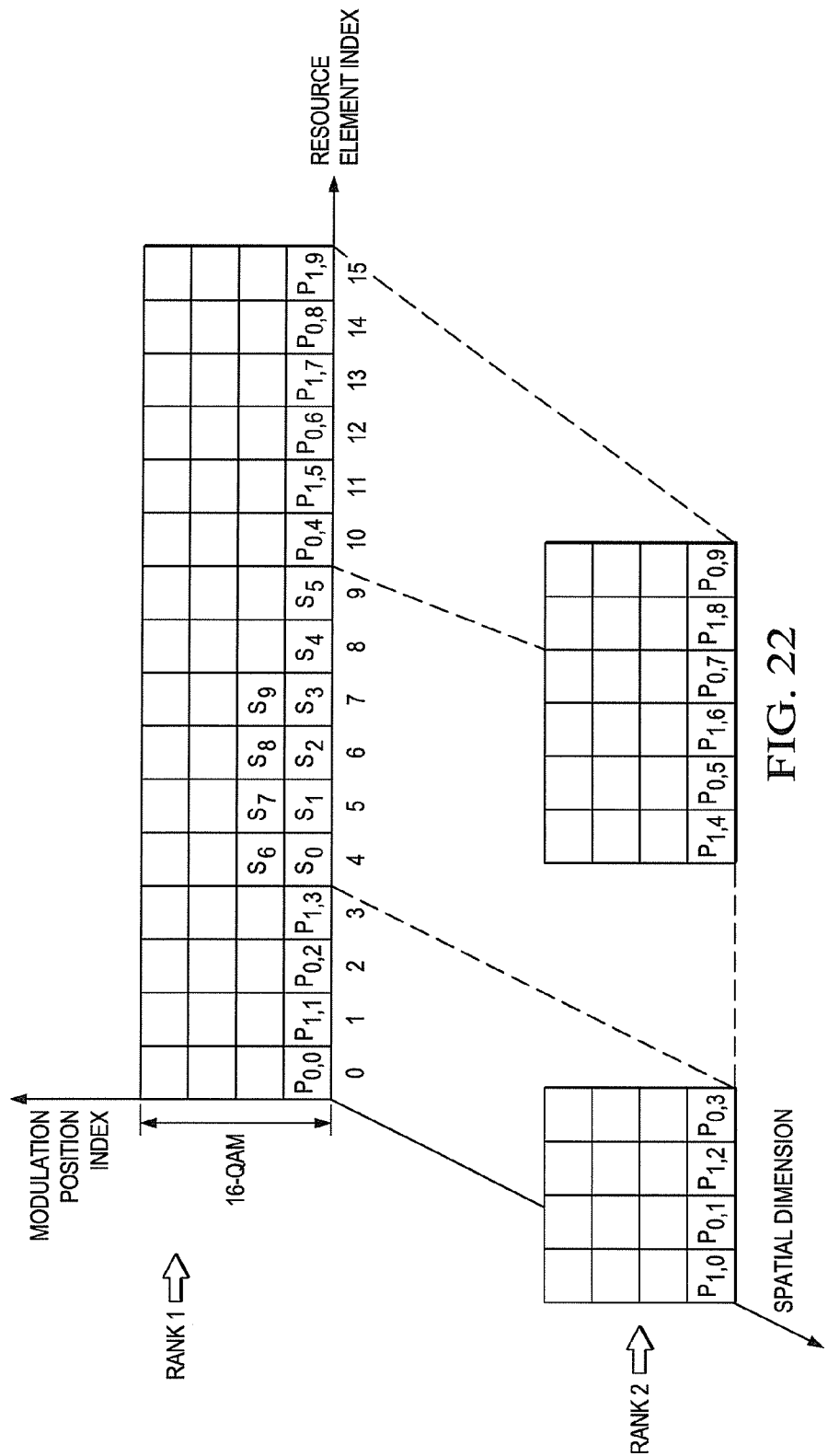
FIG. 22 shows an example of spread coded bits on resources with different spatial dimensions suitable for the practice of the principles of another embodiment of the present disclosure.

In another embodiment of the disclosure, systematic bits priority is given in mapping coded bits, and modulation symbols formed by these coded bits, onto resource elements and spatial dimensions. FIG. 22 shows an example of spread coded bits on resources with different spatial dimensions. For example, as shown in FIG. 22, the rank (number of spatial dimensions, or layers) is 2 on resource element 0, 1, 2, 3, 10, 11, 12, 13, 14, 15; and the rank is 1 on resource element 4, 5, 6, 7, 8, 9. In this example, the same modulation order is applied to all the resources and all the layers, and the modulation order is 16-QAM. Due to the interference between MIMO layers, the CQI (channel quality indicator) on resource element 4, 5, 6, 7, 8, 9 is often higher than the CQI per layer on resource elements 0, 1, 2, 3, 10, 11, 12, 13, 14, 15. In this case, the systematic bits are given more protection by being given priority to be placed on those resource elements with smaller number of layers. On the other hand, parity bits are given priority to be placed on those resource elements with bigger number of layers. In the example shown in FIG. 22, all systematic bits, i.e., $S_0, S_1, S_2, S_3, S_4, S_5, S_6, S_7, S_8, S_9$, are placed on resource elements index 4, 5, 6, 7, 8, 9, while all parity bits, i.e., $P_{0,0}, P_{1,1}, P_{0,2}, P_{1,3}, P_{1,0}, P_{0,1}, P_{1,2}, P_{0,3}, P_{0,4}, P_{1,5}, P_{0,6}, P_{1,7}, P_{0,8}, P_{1,9}, P_{1,4}, P_{0,5}, P_{1,6}, P_{0,7}, P_{1,8}, P_{0,9}$, are placed on resource elements 0, 1, 2, 3, 10, 11, 12, 13, 14, 15.

The prioritization of systematic bit may also be implemented by defining multiple regions along the dimension of modulation positions. For example, for the 64-QAM constellation as defined in TABLE 2 and FIG. 12, two regions are defined, i.e., a first region which contains $b_0, b_1, b_2, b_3$ for systematic bits and a second region which contains $b_4, b_5$ for parity bits. Systematic bits are prioritized in the first region while parity bits are prioritized in the second region. The first region may contain some parity bits in certain cases, e.g., there are not enough systematic bits to fill up the first region. Similarly, the second region may contain some systematic bits in certain cases, e.g., there are not enough parity bits to fill up the second region. All the aforementioned embodiments, interleaving steps may be performed separately in these two regions. Because the modulation positions are divided into two regions, the interleaving/permutation along modulation positions needs to be done separately for these two regions. In other words, the region $\{b_0, b_1, b_2, b_3\}$ is permuted as if it is a 16-QAM modulation while $\{b_4, b_5\}$ is permuted as if it is a QPSK modulation. Again, there may still be variations of this idea. For example, instead of defining two regions, two starting points and directions may be defined separately for systematic bits and parity bits. Systematic bits start at the modulation positions with the strongest protection and move towards modulation positions with weaker protection while parity bits start at the modulation positions with the weakest protection and move towards modulation positions with stronger protection.

In another embodiment of the present disclosure, the coded bits of each code block are allocated as uniformly as possible on different modulation positions. There are various ways to achieve this goal. One approach is to enumerate all of the permutation patterns of the modulation positions. The permutation patterns for the modulation positions of QPSK and 16-QAM are shown in TABLE 3. By assigning different permutation patterns to different modulation symbols, the modulation positions of the coded bits are changed in a code block. By doing so, the coded bits of each code block are roughly uniformly distributed among all modulation positions. So no code block is particularly favored or disadvantaged. Another benefit of interleaving or permutation along the modulation positions is to alleviate the problem caused by I-Q imbalance. If the SNR on I-branch and Q-branch is different, interleaving or permutation can ensure the coded bits of each code block spread across both I and Q branches.

TABLE 3

| Modulation | Modulation position permutation |
|---|---|
| QPSK | 01, 10 |
| 16-QAM | 0123, 0132, 0213, 0231, 0312, 0321, 1023, 1032, 1230, 1203, 1302, 1320, 2013, 2031, 2103, 2130, 2301, 2310, 3012, 3021, 3102, 3120, 3201, 3210 |

Obviously, a subset of the permutation patterns may be selected. For example, one seed permutation pattern with its cyclic shifted versions may be used as one subset of patterns. A few examples for QPSK, 16-QAM, and 64-QAM are shown in TABLE 4. In TABLE 4, the natural ordering patterns are used as the seed pattern. The subset of permutation patterns are generated by cyclic shifts of the seed pattern. These permutation patterns may be applied to modulation symbols on different resource elements. These subsets of patterns may change every resource elements, or every a few resource elements. By doing so, the coded bits of each code block will be shifted to different modulation positions in different modulation symbols. Therefore, each code block will get roughly equal protection from modulation. This technique may also be applied in retransmissions in HARQ. One example of application is to change the permutation patterns of the same modulation symbols across transmissions. This may be achieved by using different cyclic shifts of the same seed permutation pattern, or using different seed permutation patterns in retransmissions.

TABLE 4

| Modulation | Seed permutation pattern | Cyclic shifts of seed permutation patterns |
|---|---|---|
| QPSK | 01 | 01, 10 |
| 16-QAM | 0123 | 0123, 1230, 2301, 3012 |
| 64-QAM | 012345 | 012345, 123450, 234501, 345012, 450123 501234 |

Certainly, the selection of a subset of permutation patterns may be various and depends on other design objectives. For example, not all cyclic shifts are needed in the selected subset. Cyclic shifts from multiple seed permutation patterns may be selected. In one preferable embodiment of the disclosure, the preferred seed for QPSK, 16-QAM (as shown in FIG. 11), 64-QAM (as shown in FIG. 12) are listed in TABLE 5. Because of the relatively higher order modulation, the protection level on some positions is equal, while the protection level on some other positions is different. For the constellation of 16-QAM as shown in FIG. 11 and the constellation of 64-QAM as shown in FIG. 12, $b_0$ and $b_1$ receives the strongest protection, $b_2$ and $b_3$ receive less protection, while $b_4$ and $b_5$ (in the case of 64-QAM) receive the least amount of protection. According to TABLE 5, 0213 and its cyclic shifted versions are used for 16-QAM, while 042153 and its cyclic shifted versions are used for 64-QAM. Another preferred seed permutation for 16-QAM is 0312 (not shown in TABLE 5). Other preferred seed permutations for 64-QAM are 024135, 052143, 043152, 053142, 025134, 034125, 035124 (not shown in TABLE 5). The preferred seed permutation pattern may change as the constellation design of 16-QAM or 64-QAM changes.

TABLE 5

| Modulation | Preferred Seed permutation pattern | Cyclic shifts of seed permutation patterns |
|---|---|---|
| QPSK | 01 | 01, 10 |
| 16-QAM | 0213 | 0213, 2130, 1302, 3021 |
| 64-QAM | 042153 | 042153, 421530, 215304, 153042, 530421, 304215 |

Figure 23:
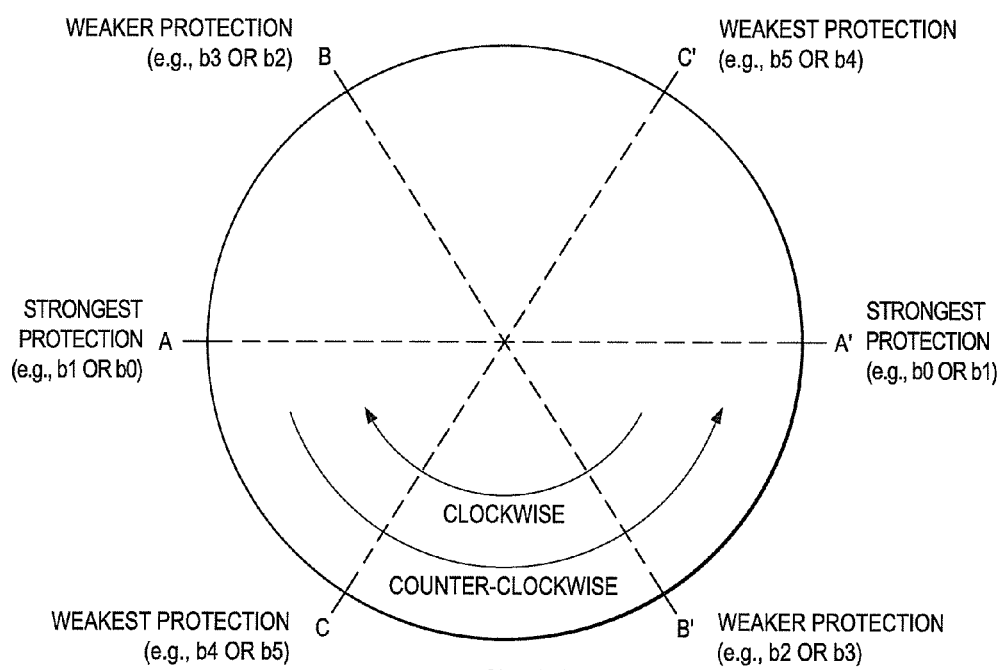
FIG. 23 shows a general method of obtaining the preferred permutation pattern for 64-QAM suitable for the practice of the principles of another embodiment of the present disclosure.

FIG. 23 shows a general method of obtaining the preferred permutation pattern for 64-QAM. The modulation positions are placed with the same level of protection at two ends of a diameter of a circle, and the modulation positions are placed with different level of protection at different angle along the circle. For example, the modulation positions of $b_0$ and $b_1$ are placed with the strongest protection at two ends of diameter A-A' of the circle as shown in FIG. 23, the modulation positions of $b_2$ and $b_3$ are placed with the weaker protection at two ends of diameter B-B' of the circle, and the modulation positions of $b_4$ and $b_5$ are placed with the weakest protection at two ends of diameter C-C' of the circle. Different preferred seed permutation patterns, and their cyclic shifts, may be obtained by reading the positions along the circle, starting from any position and by going either clockwise or counter-clockwise. In this way, maximum separation of the modulation positions with the same level of protection is achieved. This method is also applicable to other modulation orders. As shown in TABLE 5, a preferred seed for 64-QAM is 042153. According to FIG. 23, when starting from point A' and counting in a counter-clockwise along the periphery of the circle, $b_0 b_4 b_2 b_1 b_5 b_3$ is achieved. Therefore, a preferred seed for 64-QAM is 046153. By the same method, all of the preferred permutation pattern maybe achieved for 64-QAM. Although the seed permutation patterns are generated in this way, and their cyclic shifts, are preferable, this disclosure certainly covers the application of the modulation position interleaving, permutation, shuffling, swapping, re-arranging on resource elements and/or across retransmissions with any pattern or in any fashion.

Figure 24:
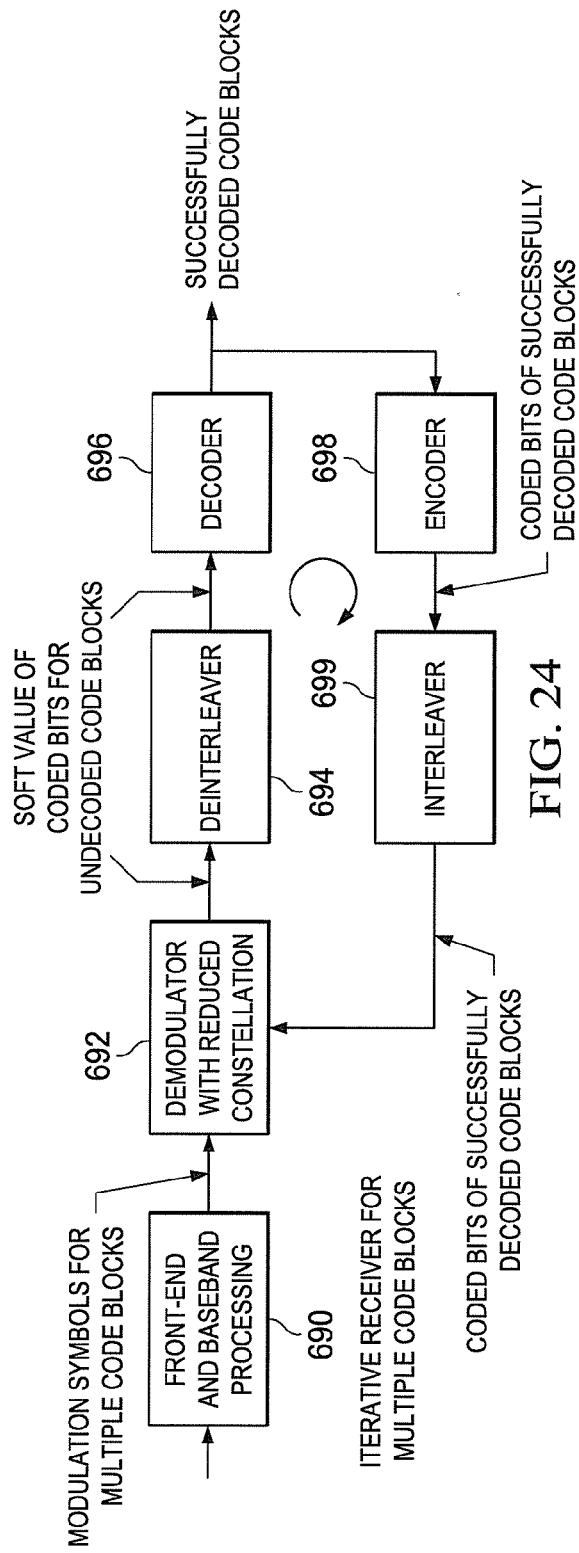
FIG. 24 illustrates an iterative receiver for decoding multiple code blocks multiplexed within same modulation symbols suitable for the practice of the principles of another embodiment of the present disclosure.

In another embodiment of this disclosure, an iterative operation is proposed for receiving the multiple code blocks that are multiplexed together within modulation symbols. With the aforementioned channel interleaver design, the coded bits of different code blocks are multiplexed in the same modulation symbol. FIG. 24 illustrates an iterative receiver for decoding multiple code blocks multiplexed within same modulation symbols. Here, an iterative operation is proposed to improve the receiver performance. An illustration of this operation is shown in FIG. 24. After processed by receiver front end and some baseband processing stage 690, e.g., FFT, channel estimation, equalization etc., soft values of coded bits are obtained by demodulating the modulation symbol by demodulator 692. These soft values are then deinterleaved by deinterleaver 694 and are fed into decoder 696. There are multiple code blocks. Decoder 696 attempts to decode one, or multiple, or all of the code blocks. Parallel processing is also possible in the decoding operation. After the decoding operation, some code blocks may be successfully decoded while some others are not. In this case, the code blocks of those decoded code blocks are reconstructed. Because the coded bits of these blocks are multiplexed in the same modulation symbols with the coded bits of those code blocks that are unsuccessful, the information of these coded bits are used to help the detection of the coded blocks that are yet unsuccessful. Code clocks successfully decoded are feedback to an encoder 698 and then fed to an interleaver 699. Therefore, the information of these successfully decoded code blocks are used to help the detection of the coded blocks that are yet unsuccessful.

Figure 26:
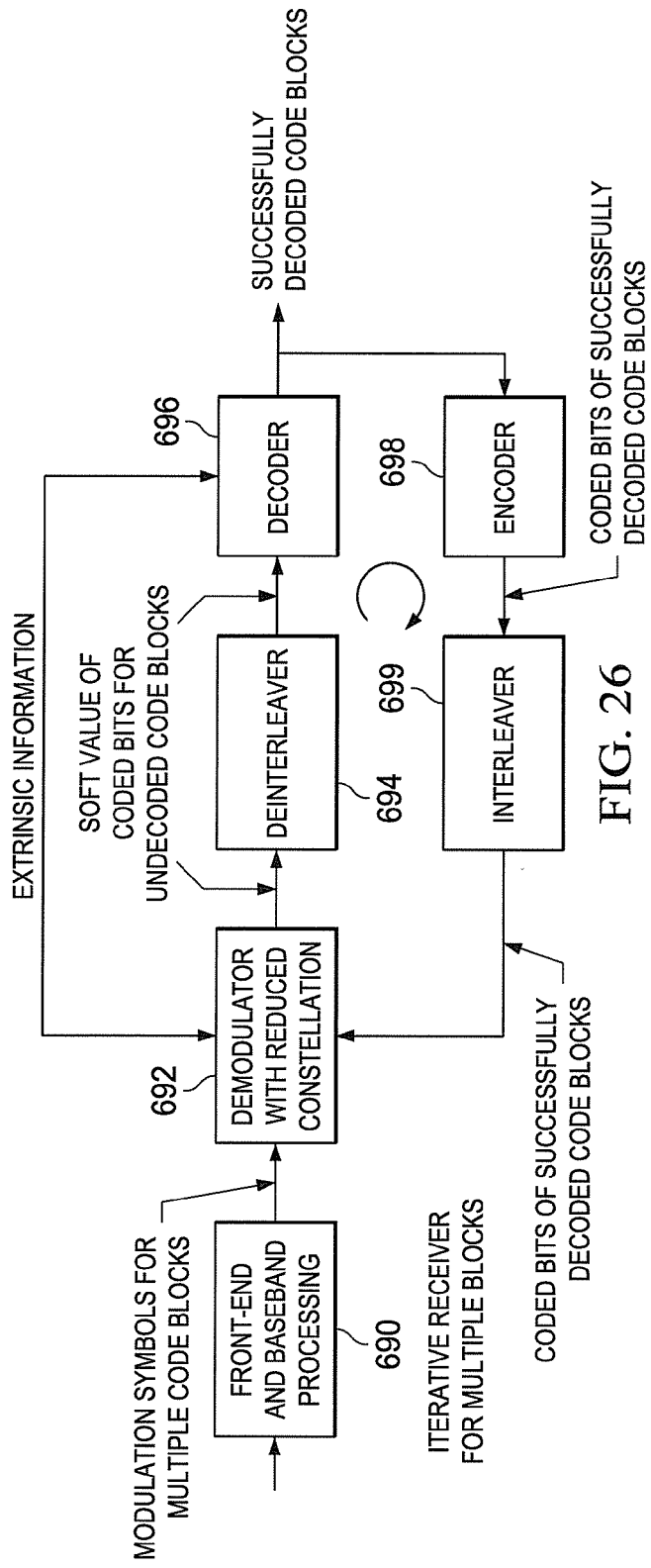
FIG. 26 illustrates an alternative iterative receiver for decoding multiple code clocks multiplexed in same modulation symbols suitable for the practice of the principles of another embodiment of the present disclosure.

FIG. 25 shows an example of a reduced constellation which improves the detection performance of the transmission. For example, a 16-QAM constellation $b_3b_2b_1b_0$ is shown in subpart (a) of FIG. 24. $b_3$ is supposed to belong to code block 1, $b_2$ and $b_1$ are supposed belong to code block 2, and $b_0$ is supposed belong to code block 3. If code block 2 is successfully decoded, the knowledge of the value of $b_2$ and $b_1$ is obtained. If $b_2=0$ and $b_1=1$, then the constellation is reduced as shown in FIG. 25. In this case, the demodulation of $b_3$ and $b_0$ based on the reduced constellation may have an improved performance In another embodiment of the disclosure, the iterative operation may be performed without correctly decoding and re-encoding some of the code blocks. Instead, reliability of the coded and information bits may be used to pass through the iterations to improve detection performance. One representation of reliability is called extrinsic information, which is the new likelihood information about each bit that is passed between the multiple processing blocks within the iterative loop. An example is shown in FIG. 26. FIG. 26 illustrates an alternative iterative receiver for decoding multiple code clocks multiplexed in same modulation symbols. Because FIG. 26 is almost same as FIG. 24, detailed explanation is omitted and only difference will be described. Extrinsic information is passed between demodulator 692 and decoder 696. Each takes the extrinsic information from the other as prior information in the calculation of likelihood of each bit and generates a new round of extrinsic information. For a successful decoding, as the iteration goes on, the likelihood of the bits will improve and eventually leads to decoding success.

Figure 27:
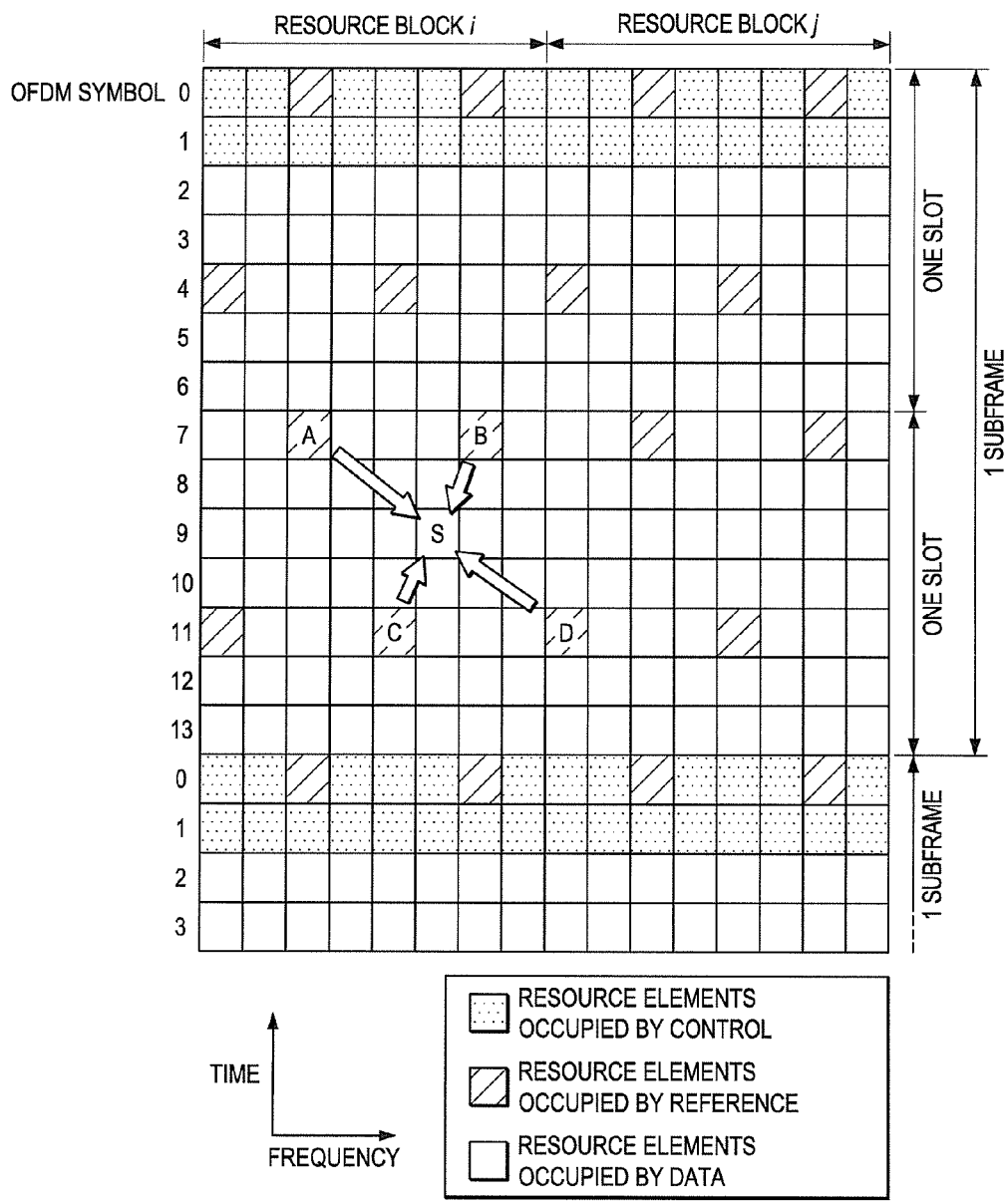
FIG. 27 shows the downlink subframe structure in a 3rd Generation Partnership Project (3GPP) LTE system.

In an LTE system, the downlink subframe structure is shown in FIG. 27. As shown in FIG. 27, each subframe contains two slots with each slot containing seven OFDM symbols (i.e. OFDM symbols 0-6) in time domain. Control channel signals are located in the first two or three OFDM symbols in a subframe. In this case, control channel signals are located in the first two OFDM symbols. Reference signals are located at OFDM symbol 0, 4, 7, and 11. For simplicity, only the reference signals of the first transmit antenna will be discussed. In frequency domain, data may be presented by multiple resource blocks, such as resource blocks i and j. The ideas of the present disclosure may certainly be extended to systems with multiple transmit antennas and multiple reference signals. In order to maintain good channel estimation performance, interpolation or averaging of downlink reference signals is usually used. For example, as shown in FIG. 27, interpolation of reference signals at resource elements A, B, C, and D can be used to obtain channel estimation for resource element S with improved performance. However, this also means that the demodulation of the modulation symbol in resource element S need to wait until reference signals in resource element C and D are received. In other words, if the demodulation of resource element S happens before OFDM symbol 11 that contains resource elements C and D, the channel estimation performance for resource element S may be negatively impacted.

In the present disclosure, methods and apparatus to enable fast decoding of transmissions with information bits or parity bits from multiple coded packets are also proposed.

Aspects, features, and advantages of the present disclosure are readily apparent from the following detailed description, simply by illustrating a number of particular embodiments and implementations, including the best mode contemplated for carrying out the disclosure. The present disclosure is also capable of other and different embodiments, and several details can be modified in various obvious respects, all without departing from the spirit and scope of the disclosure. Accordingly, the drawings and description are to be regarded as illustrative in nature, and not as restrictive. The present disclosure is illustrated by way of example, and not by way of limitation, in the figures of the accompanying drawings. In the following illustrations, downlink data channel in LTE systems is used as an example. The technique illustrated in the present disclosure, may certainly be used in uplink data channel in LTE systems, control channels in either downlink or uplink in LTE systems, and other data, control, or other channels in other systems whenever applicable.

When multiple code blocks are transmitted, the performance of the data transmission is dictated by the code block which has the worst performance. The channel interleaver, including the mapping from coded bits of different code blocks to modulation symbols, and the mapping from modulation symbols to time, frequency, and spatial resources, needs to be carefully designed to make sure each code block get roughly the same level of protection. When multiple code blocks are transmitted, it is beneficial to allow the receiver to start decoding of some code blocks while the receiver is still demodulating modulation symbols for other code blocks. In an LTE system, this presents a challenge because the channel estimation performance might be impacted if there are not enough reference signals at the time of demodulation and decoding. In the present disclosure, techniques that allow fast decoding of multiple code blocks are proposed while good channel estimation performance is maintained.

In an OFDMA system, e.g., LTE, there are normally multiple OFDM symbols in a subframe. In LTE, reference signals are present in a few OFDM symbols called Reference Signal (RS) OFDM symbols, while absent in other OFDM symbols.

In one embodiment of the present disclosure, multiple OFDM symbols in a subframe are separated into groups with the boundary between at least two groups located in the Reference Signal OFDM symbols, or those OFDM symbols right before or right after the Reference Signal OFDM symbols. Each group contains resource elements that will carry coded bits from at least one code block. The resource elements in each group are contiguous or closely to each other in time domain. The receiver can start decoding of at least one code block after receiving all the resource elements in each group.

Figure 28:
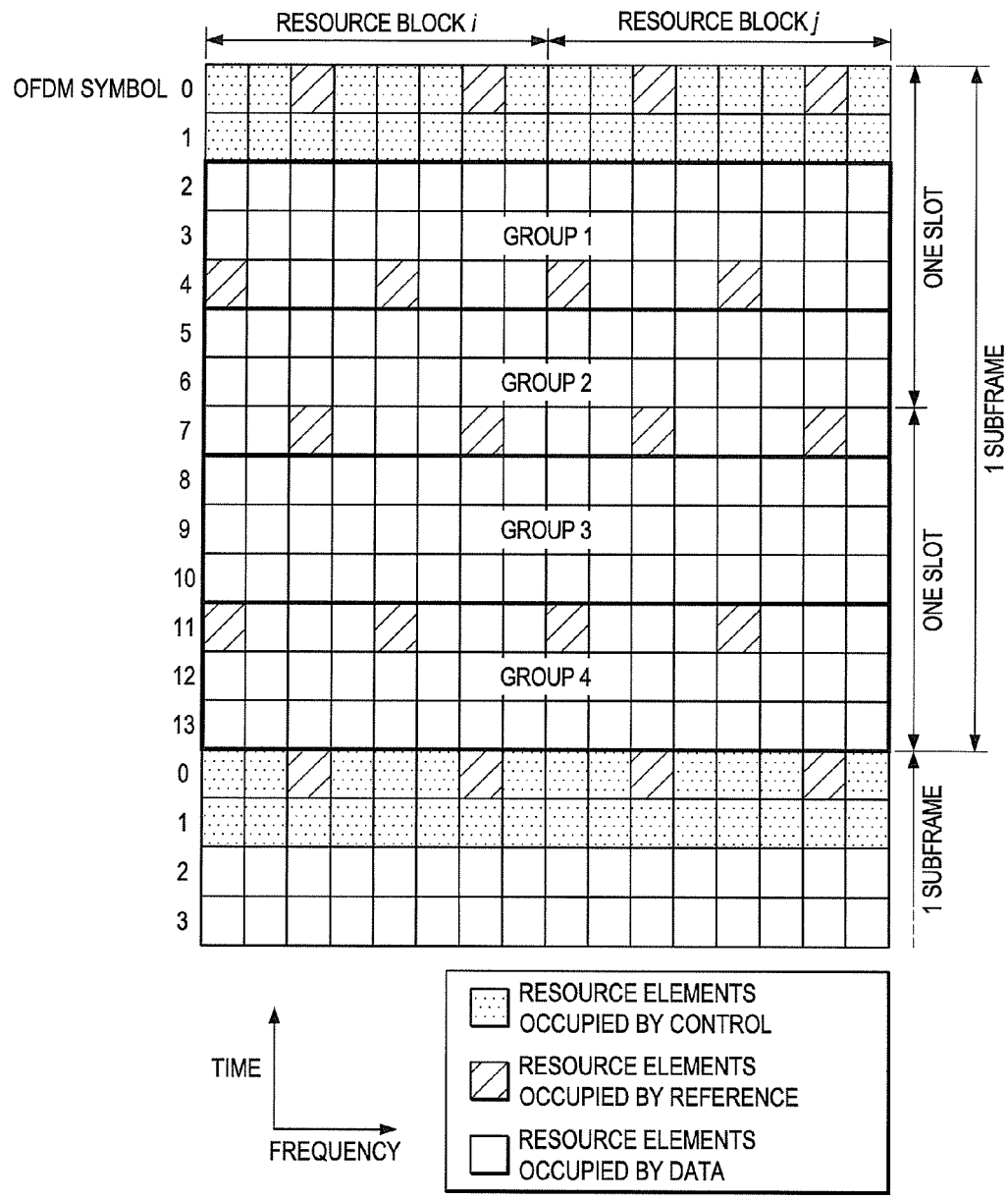
FIG. 28 shows another example of the configuration of grouping multiple OFDM symbols in a subframe suitable for the practice of the principles of one embodiment of the present disclosure.

FIG. 28 shows one example of the configuration of grouping multiple OFDM symbols in a subframe constructed according to one embodiment of the present disclosure. As shown in FIG. 28, control channel signals are located in the first two or three OFDM symbols in a subframe. In this case, control channel signals are located in the first two OFDM symbols. Group 1 is defined as a set of resource elements in OFDM symbol 2, 3, and 4 that are available to data channel; Group 2 is defined as a set of resource elements in OFDM symbol 5, 6 and 7 that are available to data channel; Group 3 is defined as a set of resource elements in OFDM symbol 8, 9, and 10 that are available to data channel; Group 4 is defined as a set of resource elements in OFDM symbol 11, 12, and 13 that are available to data channel. OFDM symbol 4 contains downlink reference signal; the boundary between Group 1 and Group 2 are located between OFDM symbol 4 and 5. OFDM symbol 11 contains downlink reference signals; the boundary between Group 3 and Group 4 are located between OFDM symbol 10 and 11. Because the boundary is always at or close to where the reference signal is, the receiver can start decoding of the code blocks carried within a group right after the group is received, or wait for one additional OFDM symbol, without sacrificing channel estimation performance. The receiver can take advantage of the latest available reference signal for the demodulation and decoding of the code blocks carried within a group. For example, there are 8 code blocks, the coded bits of two code blocks may be put into each group. For example, coded bits of code block 1 and 2 are contained in Group 1. After receiver received OFDM symbol 2, 3, 4, because all the resource elements in Group 1 is contained in these OFDM symbols, the receiver has received all the coded bits for code block 1 and 2. Therefore, the receiver can start decoding of these two code blocks. In this way, the receiver does not have to wait until the end of the subframe (after OFDM symbol 13) to start decoding. This design brings a few benefits to the receiver design in terms of hardware complexity and power consumption.

Figure 28A:
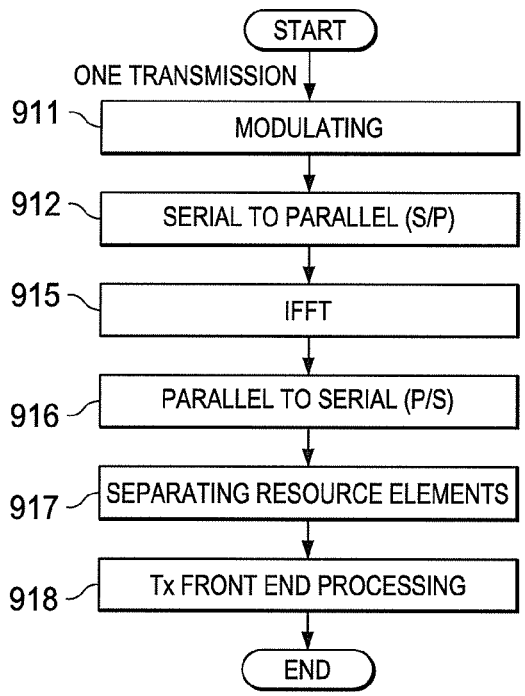
FIG. 28(a) is a flow chart illustrating a method of transmitting data signals by separating resource elements having coded bits suitable for the practice of the principles of one embodiment of the present disclosure.
Figure 28B:
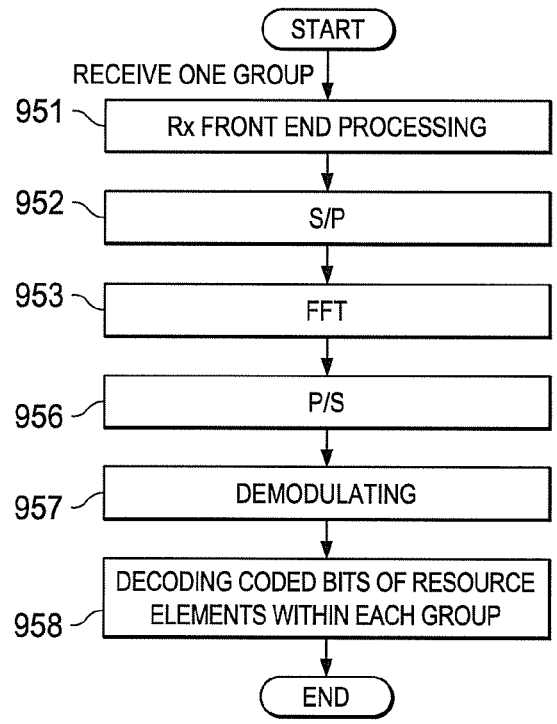
FIG. 28(b) is a flow chart illustrating a method of receiving and decoding grouped resource elements having coded bits at a receiver.

FIG. 28(a) is a flow chart illustrating a method of transmitting data signals by separating resource elements having coded bits suitable for the practice of the principles of one embodiment of the present disclosure. FIG. 28(b) is a flow chart illustrating a method of receiving and decoding grouped resource elements having coded bits at a receiver. In FIG. 28(a), data bits are modulated in step 911, are then transformed from serial to parallel in step 912. Then data is transformed by IFFT method at step 915 and then processed from parallel to serial at step 916. Then the data in different code blocks are mapped to resources elements that are separated into different groups in step 917. Finally, transmitting front end having one or multiple transmitting antennas transmits the OFDM symbols that includes one or multiple groups of resource elements. In FIG. 28(b), the receiver starts receive OFDM symbols that include one group of resource elements by receiving front end process at step 951. Then the received OFDM symbols are processed by serial to parallel stage at step 952 and by FFT method at step 953. The group of resource elements are processed by parallel to serial processing at step 956 and finally are demodulated at step 957. The receiver then decodes the coded bits of the resources elements within the one group at step 958. As the receiver continues to receive OFDM symbols, the following groups of resource elements can be received and processed.

Figure 29:
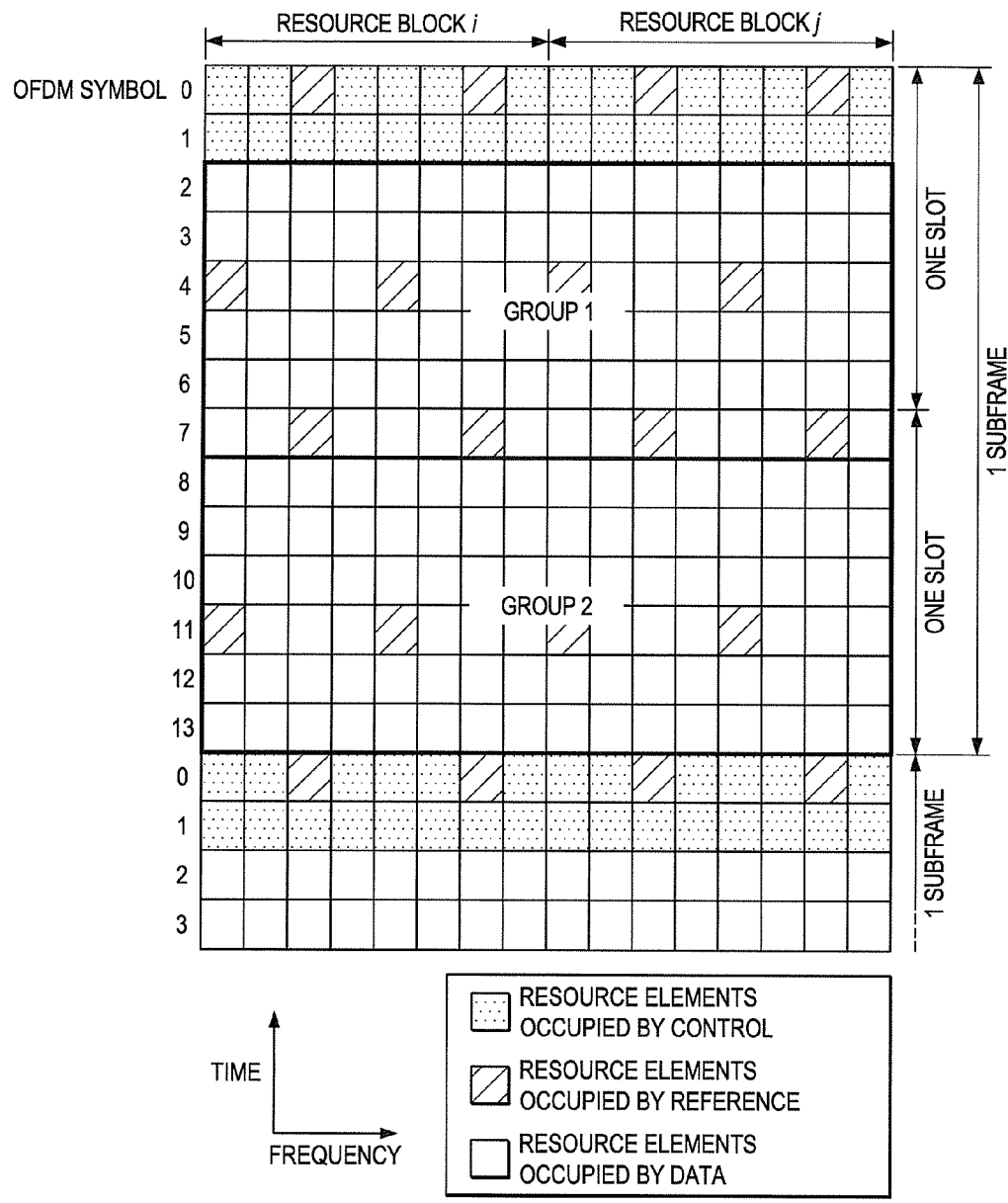
FIG. 29 shows another example of the configuration of grouping multiple OFDM symbols in a subframe suitable for the practice of the principles of one embodiment of the present disclosure.

FIG. 29 shows another example of the configuration of grouping multiple OFDM symbols in a subframe suitable for the practice of the principles of the present disclosure. In this example, two groups are defined. Control channel signals are located in the first two or three OFDM symbols in a subframe. Group 1 includes resource elements in OFDM symbol 2, 3, 4, 5, 6, 7 and Group 2 includes resource elements in OFDM symbol 8, 9, 10, 11, 12, 13. OFDM symbols 2-13 in a subframe are separated into two groups with the boundary between two groups located at OFDM symbol 7 and 8. Note that OFDM symbol 7 carries Reference Signals. Different configuration of groups can be used in different situations, such as, but not limited to, different UEs, different subframes, different quality of service, etc. without departing from the spirit of this disclosure.

Figure 30:
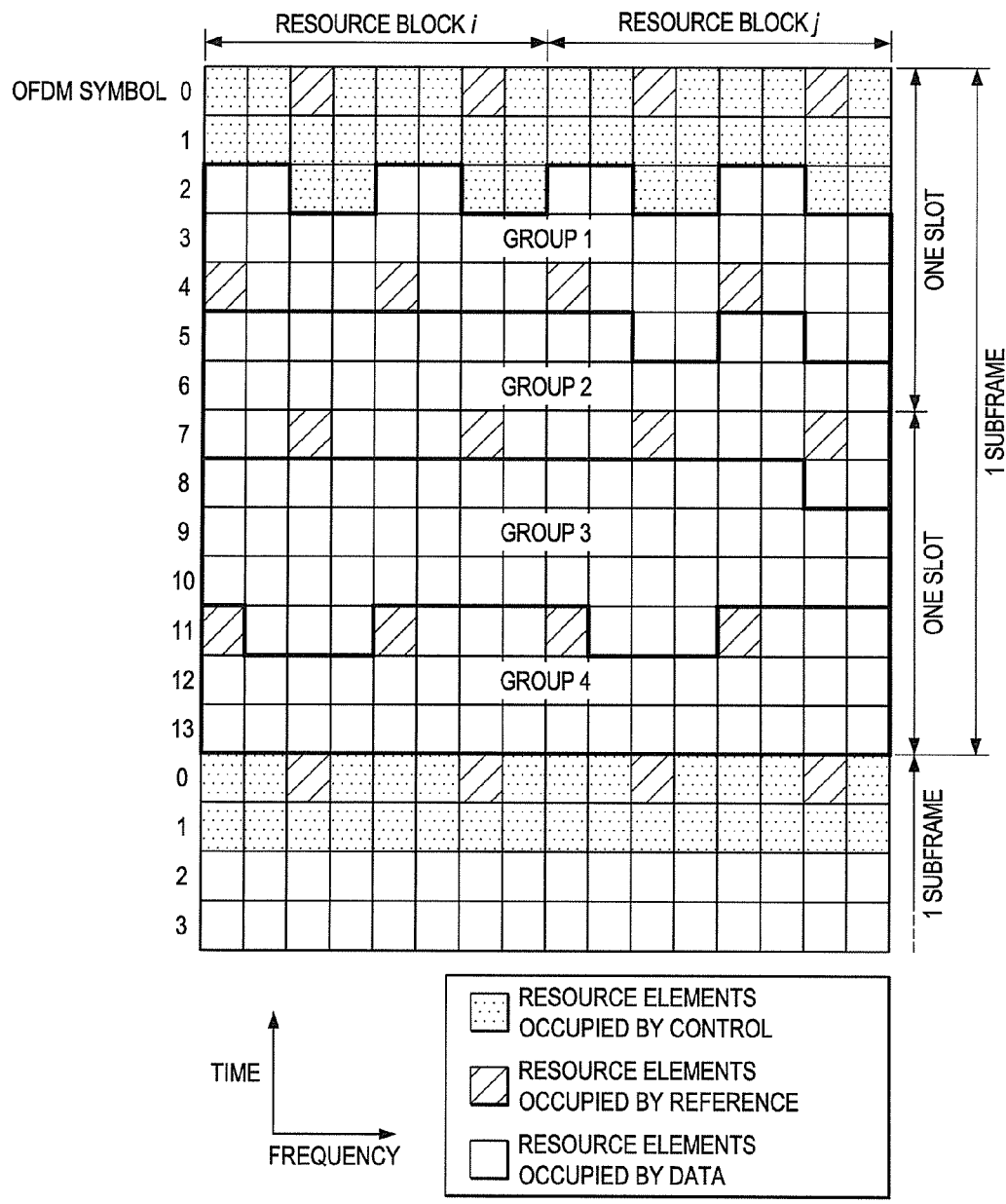
FIG. 30 shows another example of the configuration of grouping multiple OFDM symbols in a subframe suitable for the practice of the principles of one embodiment of the present disclosure.

FIG. 30 shows another example of the configuration of grouping multiple OFDM symbols in a subframe suitable for the practice of the principles of the present disclosure. In this example, although each group includes resource elements from contiguous OFDM symbols, some OFDM symbols, e.g., OFDM symbols 5, 8, and 11, may contain multiple groups. Again, note that the boundaries between groups are all located in OFDM symbols that carry Reference Signals or OFDM symbols that are immediately before or after the OFDM symbols that carry Reference Signals. This design allows more flexible group definition than the OFDM symbol based grouping while maintaining the benefits of allowing fast decoding without channel estimation performance loss.

Figure 32:
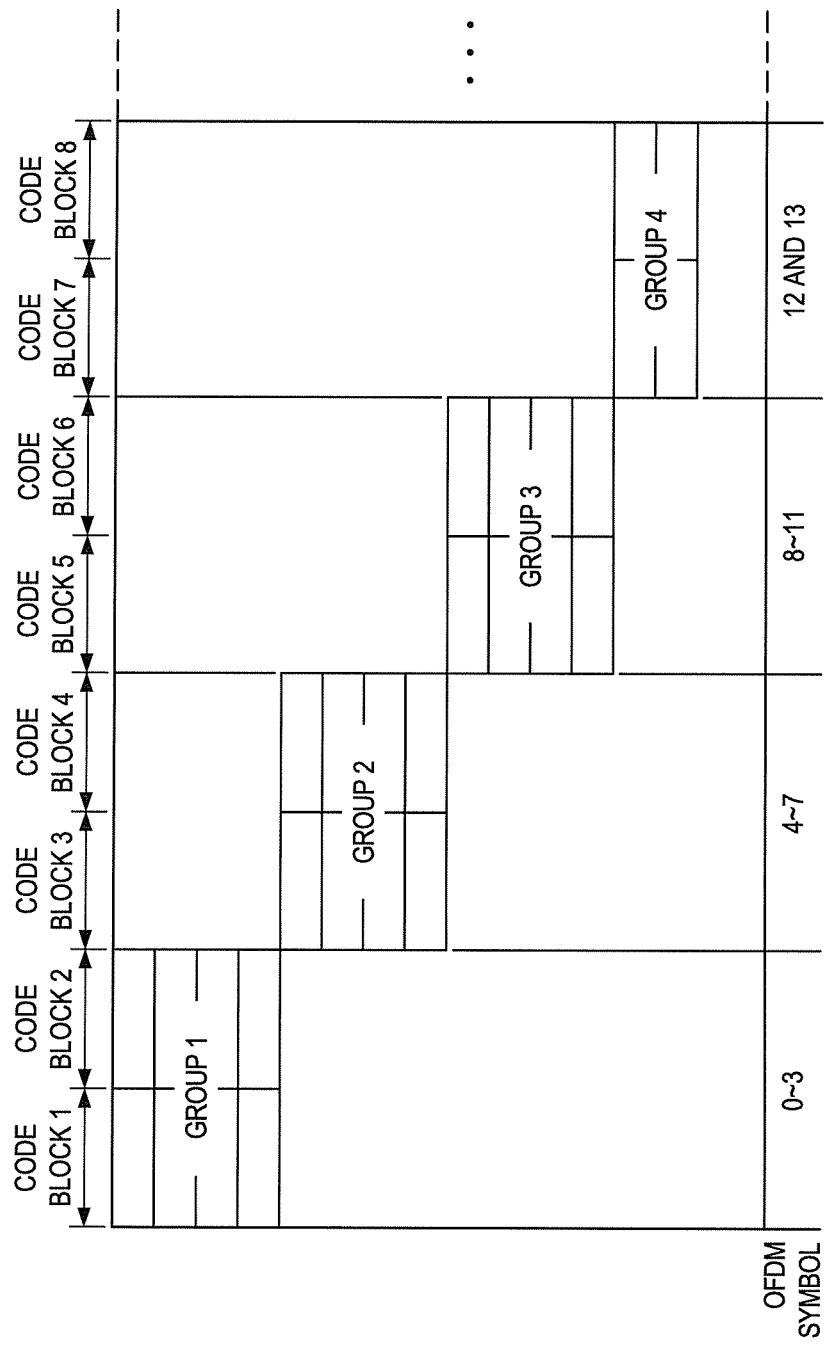
FIG. 32 shows an example of the configuration of grouping code bock suitable for the practice of the principles of another embodiment of the present disclosure.

In another embodiment of this disclosure, groups are defined based on code blocks instead of resource elements. FIG. 32 shows an example of the configuration of grouping code bock suitable for the practice of the principles of this embodiment of the present disclosure. Each group contains coded bits of at least one code block and may contain multiple code blocks. For example, code blocks 1 and 2 may be grouped as the first group, code blocks 3 and 4 may be grouped as the second group, code blocks 5 and 6 may be grouped as the third group, and code blocks 7 and 8 may be grouped as the fourth group. The first group is placed in the first a few OFDM symbols, and the second group is placed in the next a few OFDM symbols, etc. In this way, fast decoding of some code blocks without waiting until the end of a subframe is allowed.

With the group defined in aforementioned embodiments, either based on resource elements or code blocks, the rest of channel interleaving operations within each group may be defined. The channel interleaver may be quite general. For example, the channel interleaver may spread the coded bits of each code block within a group to as many resource elements in this group as possible. The channel interleaver may spread the coded bits of each code block within a group to different modulation positions as evenly as possible. The channel interleaver may attempt to make sure each modulation symbol within a group contains coded bits from multiple code blocks so that burst error on modulation symbols is spread on these code blocks.

Figure 31:
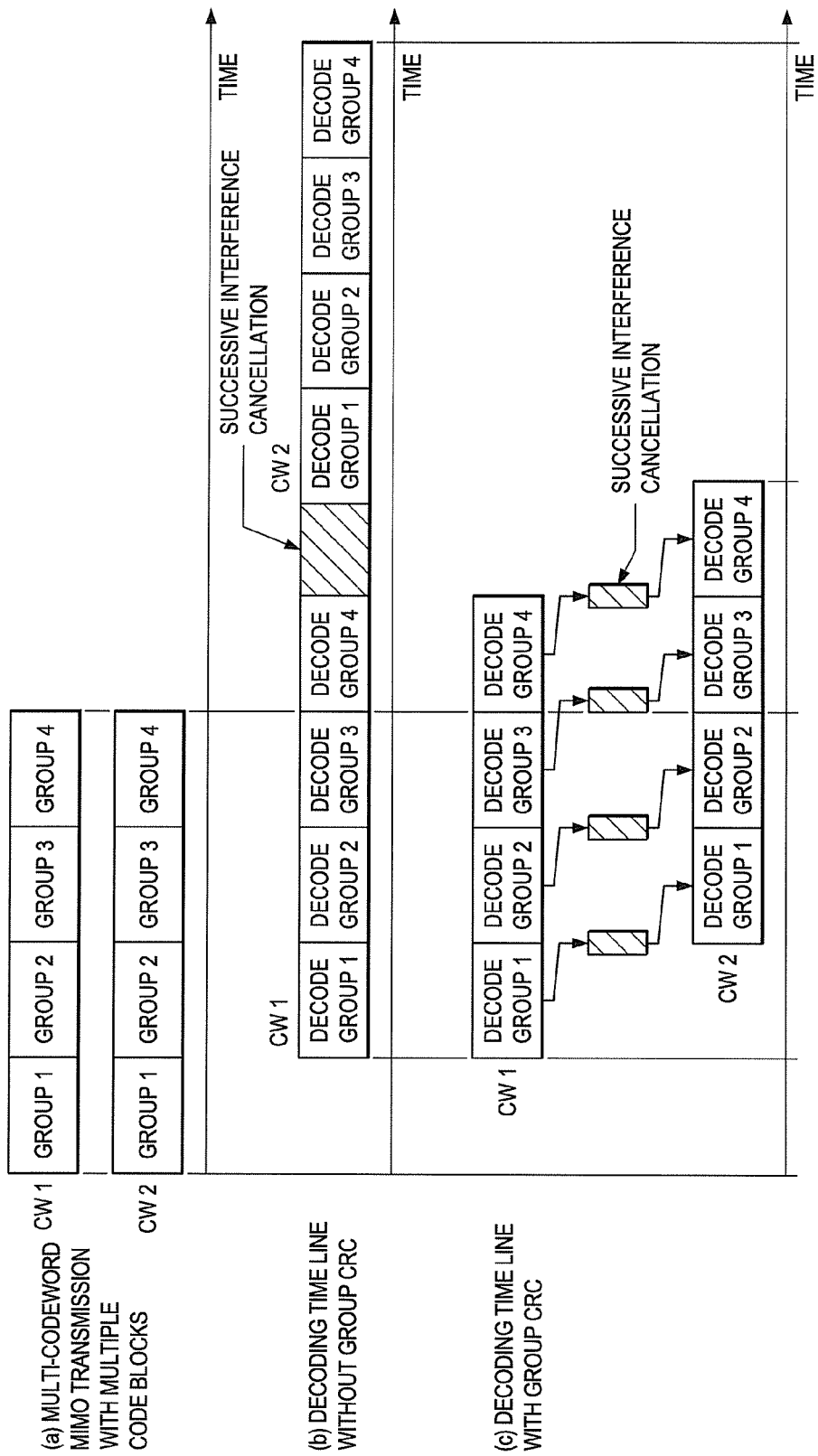
FIG. 31 shows examples of parallel processing for successive interference cancellation either with or without grouping cyclic delay diversity (CRC) suitable for the practice of the principles of the present disclosure.

The aforementioned embodiments of channel interleaver design can be extended to the case of MIMO transmissions. Suppose multiple layers are allocated to a MIMO codeword. This scenario can happen in LTE systems, e.g., when the SU-MIMO transmission has rank greater than 1. In this case, a spatial dimension can be added to the definition of a group. A MIMO codeword represents a transport block. A MIMO processor generating soft bits for at least one of a plurality of code blocks of a MIMO codeword FIG. 31 shows examples of parallel processing for successive interference cancellation either with or without group cyclic delay diversity (CDD) suitable for the practice of the principles of the present disclosure. As shown in FIG. 31, four groups are defined within a subframe: Group1 can be defined as a set of resource elements in OFDM symbol 2, 3, and 4, including multiple MIMO layers or MIMO streams on those resource elements; Group 2 can be defined as a set of resource elements in OFDM symbol 5, 6, and 7, including multiple MIMO layers or MIMO streams on those resource elements; etc.

As shown in subpart (a) of FIG. 31, within each group there are two layers; within each group there are two layers or streams; within each MIMO layer or MIMO stream there are four groups. In a multi-codeword MIMO transmission, each layer may incorporate a corresponding MIMO codeword (CW), i.e. CW1 and CW2, and each CW carries multiple code blocks and a 24-bit CRC as shown in subpart (b) of FIG. 31. For each MIMO codeword, this CRC is applied to the whole MIMO codeword (a transport block having multiple code blocks), i.e., all the code blocks in Group 1, 2, 3, and 4 that belong to the MIMO codeword. Therefore, with the group definition, decoding of code blocks in MIMO CW 1 may be started immediately after demodulation of modulation symbols in Group 1. By doing so, the demodulation of the later groups is parallelized with the decoding of earlier groups. In addition, with the help of this CRC, the interference from CW1 to CW2 may be cancelled by successive interference cancellation.

Further, the parallel processing capability may be significantly enhanced. In another embodiment of the present disclosure, CRC is added to one or multiple code blocks of a codeword within a group. One example is shown in subpart (c) of FIG. 31: one CRC may be attached to each of groups. With the group definition, decoding of code blocks in CW1 may be started immediately after demodulation of Group 1. By doing so, the demodulation of the later groups is parallelized with the decoding of previous groups. With the per-group CRC, the interference from CW1 to CW2 in Group 1 may be cancelled and decoding of code blocks of CW2 in Group 1 may be started immediately after the decoding of those code blocks of CW1 in Group 1. By doing so, the demodulation of the later groups in CW1, the decoding of earlier groups in CW1, the successive interference cancellation, the demodulation of the later groups in CW2, and the decoding of earlier groups in CW2 can all be processed paralleled in one way or another.

Certainly, CRC may be added to the groups of both MIMO codewords CW1 and CW2 separately. In that case, it enables parallel processing even in the case of an iterative receiver. In other words, when the iterative receiver is used to decode CW1 and CW2, the iterative receiver for Group 1 is used in the decoding of the code blocks of CW1 in Group 1, and the decoding of the code blocks of CW2 in Group 1. In this case, even the iterative receiver can be parallelized between groups.

Certainly, many variations and receiver structures may be obtained. For example, the group definition across these two layers needs not to be exactly synchronized. This may cause some delay in processing or some performance degradation, but may allow more flexibility in group definition. Even the number of groups within each layer may be different.

What is claimed is:

1. A transmitter, comprising:
    a first cyclic redundancy check (CRC) calculator configured to generate a first CRC for a transport block of data and attach the first CRC to the transport block of data;
    a separator configured to selectively segment the transport block into one code block or a plurality of code blocks based on a size of the transport block and the first CRC;
    a second CRC calculator configured to generate a plurality of second CRCs for the plurality of code blocks when a number of code blocks is greater than one and attach the plurality of second CRCs to the plurality of code blocks, and configured to not generate the second CRC when the number of code blocks is one; and
    an encoder configured to encode the data bits of the plurality of code blocks.

2. The transmitter of claim 1 wherein the size of first CRC is 24-bits.

3. The transmitter of claim 1, wherein the transmitter is configured to transmit the first CRC and the code block when the number of code blocks is one.

4. The transmitter of claim 1, wherein the transmitter is configured to transmit the plurality of code blocks and the plurality of second CRCs when the number of code blocks is greater than one.

5. The transmitter of claim 1, wherein each of the plurality of second CRCs is generated based upon a corresponding one of the plurality of code blocks.

6. A method to transmit a transport block, comprising:
    generating a first CRC for the transport block and attaching the first CRC to the transport block;
    selectively the transport block into one code block or a plurality of code blocks based on a size of the transport block and a size of the first CRC;
    generating a plurality of second CRCs for the plurality of code blocks and attaching the plurality of second CRCs to the plurality of code blocks, when a number of code blocks is greater than one; and
    encoding the data bits of the plurality of code blocks.

7. The method of claim 6, wherein the size of first CRC is 24-bits.

8. The method of claim 6, wherein each of the plurality of second CRCs is generated based upon a corresponding one of the plurality of code blocks.

9. The method of claim 6, further comprising;
    transmitting the first CRC and the code block when the number of code blocks is one.

10. The method of claim 6, further comprising;
    transmitting the plurality of code blocks and the plurality of second CRCs when the number of code blocks is greater than one.

* * * * *

UNITED STATES PATENT AND TRADEMARK OFFICE
CERTIFICATE OF CORRECTION

PATENT NO. : 9,525,513 B2  
APPLICATION NO. : 14/877558  
DATED : December 20, 2016  
INVENTOR(S) : Zhouyue Pi et al.

Page 1 of 1

It is certified that error appears in the above-identified patent and that said Letters Patent is hereby corrected as shown below:

In the Claims

In Column 32, Line 3, "block and" should be changed to --block with--;
    Line 10, "the data" should be changed to --data--;
    Line 12, "the size of first" should be changed to --a size of the first--;
    Line 27, "selectively" should be changed to --selectively segmenting--;
    Line 29, "block and a size of" should be changed to --block with--;
    Line 34, "the data" should be changed to --data--; and
    Line 35, "the size of first" should be changed to --a size of the first--.

Signed and Sealed this  
Twenty-second Day of September, 2020

Andrei Iancu  
*Director of the United States Patent and Trademark Office*